(12) United States Patent
Akimoto et al.

(10) Patent No.: US 8,278,162 B2
(45) Date of Patent: Oct. 2, 2012

(54) METHOD FOR MANUFACTURING SEMICONDUCTOR DEVICE

(75) Inventors: Kengo Akimoto, Atsugi (JP); Daisuke Kawae, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/768,205

(22) Filed: Apr. 27, 2010

(65) Prior Publication Data

US 2010/0279474 A1 Nov. 4, 2010

(30) Foreign Application Priority Data

May 1, 2009 (JP) ................... 2009-111693

(51) Int. Cl.
*H01L 21/00* (2006.01)
*H01L 21/84* (2006.01)
(52) U.S. Cl. . 438/158; 438/104; 438/149; 257/E21.411; 257/E21.414
(58) Field of Classification Search .............. 438/104, 438/158, 160; 257/E21.411, E21.461, E27.111
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,927,814 B2 | 8/2005 | Lee et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |

(Continued)

FOREIGN PATENT DOCUMENTS

EP 1737044 A 12/2006

(Continued)

OTHER PUBLICATIONS

International Search Report (Application No. PCT/JP2010/057317) Dated Jul. 13, 2010.

(Continued)

*Primary Examiner* — Charles Garber
*Assistant Examiner* — Abdulfattah Mustapha
(74) *Attorney, Agent, or Firm* — Eric J. Robinson; Robinson Intellectual Property Law Office, P.C.

(57) ABSTRACT

A formation of a gate electrode provided over an oxide semiconductor layer of a thin film transistor is performed together with a patterning of the oxide semiconductor layer.

10 Claims, 23 Drawing Sheets

U.S. PATENT DOCUMENTS

| | | | |
|---|---|---|---|
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0108809 A1* | 6/2004 | Heo et al. ............ | 313/506 |
| 2004/0125261 A1 | 7/2004 | Lee et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0051937 A1 | 3/2010 | Kaji et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-152330 | 6/1993 |
| JP | 05152330 A * | 6/1993 |
| JP | 05-251705 A | 9/1993 |
| JP | 08-264794 A | 10/1996 |
| JP | 10-173195 | 6/1998 |
| JP | 10173195 A * | 6/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-199049 | 7/2004 |
| JP | 2004199049 A * | 7/2004 |
| JP | 2004-273614 A | 9/2004 |
| JP | 2004-273732 A | 9/2004 |
| JP | 2008-108985 | 5/2008 |
| JP | 2008-218495 | 9/2008 |
| JP | 2008218495 A * | 9/2008 |
| WO | WO-2004/114391 | 12/2004 |
| WO | WO-2008/105250 | 9/2008 |

OTHER PUBLICATIONS

Written Opinion (Application No. PCT/JP2010/057317) Dated Jul. 13, 2010.

Nakamura.M et al., "Syntheses and crystal structures of new homologous compounds, indium iron zinc oxides ($InFeO_3(ZnO)m$) (m natural number) and related compounds,", Kotai Butsuri (Solid State Physics), 1993, vol. 28, No. 5, pp. 317-327.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$-$ZnGa_2O_4$-ZnO Systems,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:AL and SN-Doped Zinc Indium Oxide Thin Film Transistors for Amoled Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties,", SID Digest '09 : SID International Symposium Digest of Technical Papers, May 31, 2009, pp. 983-985.

Sakata.J et al., "Development of 4.0-In Amoled Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size Amoled,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide.TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA Amoled Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007 vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; FE, GA, OR AL; B: MG, MN, FE, NI, CU,OR ZN] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solid (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner 1101
1102
1103
1104
1105
1106

FIG. 13
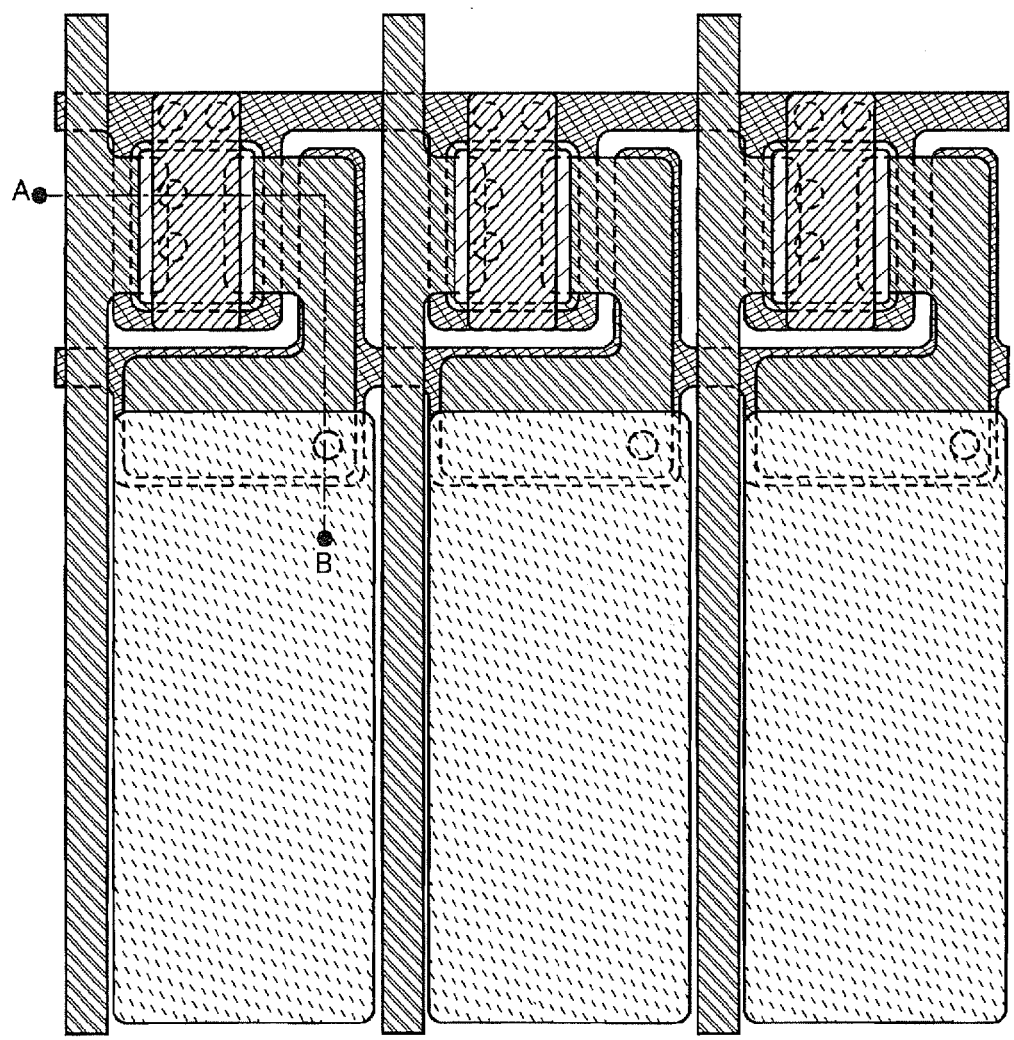
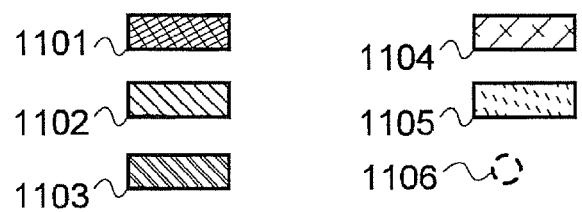

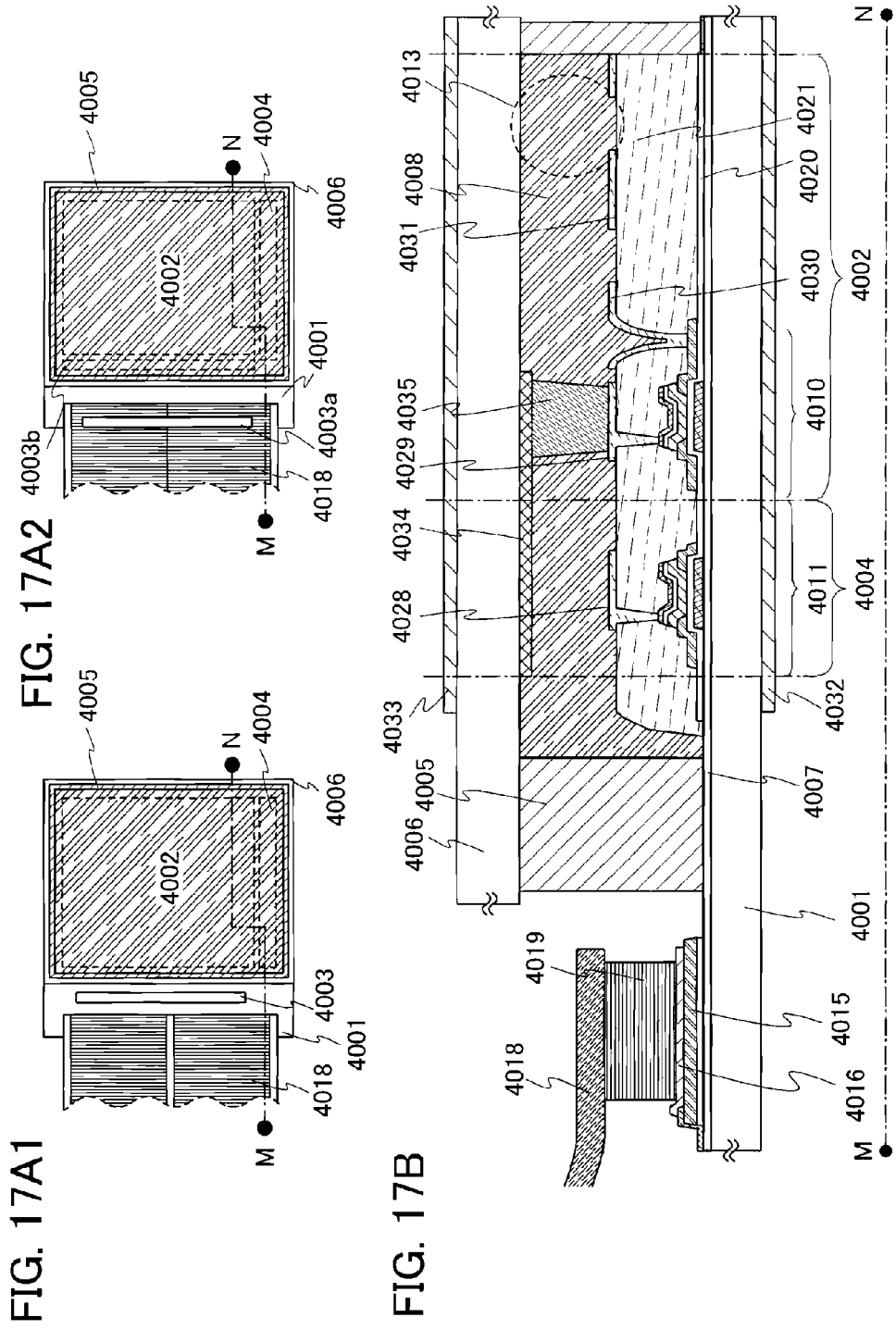

METHOD FOR MANUFACTURING SEMICONDUCTOR DEVICE

TECHNICAL FIELD

The present invention relates to a method for manufacturing a semiconductor device which includes a circuit including a thin film transistor (hereinafter also referred to as a TFT).

In this specification, a semiconductor device generally means a device which can function by utilizing semiconductor characteristics, and an electrooptic device, a semiconductor circuit, and electronic equipment are all semiconductor devices.

BACKGROUND ART

Various metal oxides are used for a variety of applications. Indium oxide is a well-known material and is used as a transparent electrode material which is necessary for liquid crystal displays and the like.

Some metal oxides have semiconductor characteristics. Examples of such metal oxides having semiconductor characteristics include tungsten oxide, tin oxide, indium oxide, and zinc oxide. References disclose a thin film transistor in which such a metal oxide having semiconductor characteristics is used for a channel formation region (Patent Documents 1 to 4, and Non-Patent Document 1).

Examples of metal oxides include not only an oxide of a single metal element but also an oxide of a plurality of metal elements (multi-component oxides). For example, $InGaO_3(ZnO)_m$ (m is a natural number) which is a homologous compound is a known material as multi-component oxides (Non-Patent Documents 2 to 4).

In addition, it has been proved that an oxide semiconductor including such an In—Ga—Zn-based oxide can be used as a channel layer of a thin film transistor (Patent Document 5, and Non-Patent Documents 5 and 6).

REFERENCE

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor," *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", KOTAI BUTSURI (SOLID STATE PHYSICS), 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

When a channel layer of a thin film transistor is formed using an oxide semiconductor, a threshold voltage is shifted in a negative or positive direction in some cases depending on a manufacturing process. Thus, a thin film transistor in which an oxide semiconductor is used for a channel layer needs to have a structure where a threshold voltage can be controlled.

The threshold voltage of the thin film transistor can be controlled to be a preferable value when the thin film transistor has the following structure. A gate electrode (upper electrode) is provided over a channel formation region with a gate insulating film interposed therebetween, a gate electrode (lower electrode) is provided below the channel formation region with a gate insulating film interposed therebetween, and a potential of the upper and/or the lower gate electrode is controlled. However, the number of processes is increased by providing gate electrodes over and below the channel formation region. Therefore, a structure is needed in which increase of the number of processes can be suppressed and the threshold voltage can be controlled more surely.

An object of an embodiment of the present invention is to provide a method for manufacturing a semiconductor device, without increase of the number of processes, including a thin film transistor which includes an oxide semiconductor for a channel layer and has the controlled threshold voltage so as to have high electric characteristics.

In order to control a threshold value to a preferable value, gate electrodes are provided over and below an oxide semiconductor film. Specifically, a gate electrode, which is also referred to as a first gate electrode, is provided below the oxide semiconductor film and a gate electrode, which is also referred to as a second gate electrode or a back-gate electrode, is provided over the oxide semiconductor film. If a formation of the second gate electrode is performed together with the patterning of the oxide semiconductor film, increase of the number of processes, caused by a process needed for formation of the second gate electrode, can be prevented.

An embodiment of the invention disclosed in this specification is a method for manufacturing a semiconductor device including the steps of forming a first conductive layer over an insulating surface; performing a first patterning to form a first gate electrode; forming a first insulating film over the first gate electrode; forming a second conductive layer over the first insulating film; performing a second patterning to form a wiring layer; forming an oxide semiconductor film, a second insulating film, and a third conductive layer over the first insulating film and the wiring layer; performing a third patterning to form an island-shaped oxide semiconductor film, an island-shaped second insulating film over the island-shaped oxide semiconductor film, and a second gate electrode over the island-shaped second insulating film; forming an interlayer insulating layer covering the first insulating film, the wiring layer, the island-shaped oxide semiconductor film, the island-shaped second insulating film, and the second gate electrode; performing a fourth patterning to form an opening portion reaching the second gate electrode and an opening portion reaching the wiring layer; forming a conductive material over the interlayer insulating layer; and performing a fifth patterning to form a lead wiring connected to the second gate electrode and a pixel electrode connected to the wiring layer.

An embodiment of the invention disclosed in this specification is a method for manufacturing a semiconductor device including the steps of forming a first conductive layer over an insulating surface; performing a first patterning to form a first gate electrode; forming a first insulating film over the first gate electrode; forming a second conductive layer over the first insulating film: performing a second patterning to form a wiring layer; forming an oxide semiconductor film, a channel protective film, a second insulating film, and a third conductive layer over the first insulating film and the wiring layer; performing a third patterning to form an island-shaped oxide semiconductor film, an island-shaped channel protective film over the island-shaped oxide semiconductor film, an island-shaped second insulating film over the island-shaped channel protective film, and a second gate electrode over the island-shaped second insulating film; forming an interlayer insulating layer covering the first insulating film, the wiring layer, the island-shaped oxide semiconductor film, the island-shaped channel protective film, the island-shaped second insulating film, and the second gate electrode; performing a fourth patterning to form an opening portion reaching the second gate electrode and an opening portion reaching the wiring layer; forming a conductive material over the interlayer insulating layer; and performing a fifth patterning to form a lead wiring connected to the second gate electrode and a pixel electrode connected to the wiring layer.

In the method for manufacturing a semiconductor device, a second oxide semiconductor film may be formed over the wiring layer by the second patterning, and a buffer layer formed from the second oxide semiconductor film may be provided by the third patterning, in a region where the oxide semiconductor film and the wiring layer overlap with each other.

In the method for manufacturing a semiconductor device, a second oxide semiconductor film is formed below the wiring layer by the second patterning.

In the method for manufacturing a semiconductor device, the lead wiring may be provided so as to overlap with the second gate electrode.

In the method for manufacturing a semiconductor device, the interlayer insulating layer may be formed using polyimide.

In the method for manufacturing a semiconductor device, the channel protective film may be formed using amorphous silicon.

In the method for manufacturing a semiconductor device, the oxide semiconductor film may include silicon oxide.

In the method for manufacturing a semiconductor device, the lead wiring may be formed to be connected to the first gate electrode.

In the method for manufacturing a semiconductor device, the second insulating film may be formed to a thickness within the range of from 50 nm to 500 nm inclusive.

According to an embodiment of the present invention, by a manufacturing method of a semiconductor device in which gate electrodes are provided over and below a channel formation region formed using an oxide semiconductor, increase of the number of processes can be suppressed and the threshold voltage can be controlled.

BRIEF DESCRIPTION OF DRAWINGS

FIG. 13 shows a layout of pixels.

FIGS. 17A1 and 17A2 are top views and FIG. 17B is a cross-sectional view, of a semiconductor device illustrating one embodiment of the present invention.

BEST MODE FOR CARRYING OUT THE INVENTION

Figure 1A:
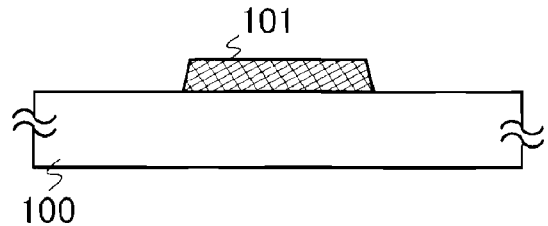
FIGS. 1A to 1E are cross-sectional views of one embodiment of the present invention.

Hereinafter, embodiments and an example of the present invention will be described with reference to the accompanying drawings. Note that the embodiments and the example can be implemented in various different ways and it is easily understood by those skilled in the art that modes and details disclosed herein can be modified in various ways without departing from the spirit and the scope of the present invention. Therefore, the present invention is not construed as being limited to description of the embodiments and the example. Note that in structures of the invention described below, the same portions or portions having similar functions are denoted by the same reference numerals, and description thereof is not repeated.

Note that as for some components shown in some of the drawings, etc. for the embodiments, the size, the layer thickness, distortion in signal waveforms, and the region are exaggerated for purposes of clarity. Thus, the embodiments of the present invention are not limited to such scales illustrated in the drawings.

Note that the terms such as "first", "second", and "third" in this specification are used in order to avoid confusion between components and do not set a limitation on number.

Embodiment 1

In this embodiment, a method for manufacturing a semiconductor device including a thin film transistor including an oxide semiconductor film which is sandwiched between two gate electrodes provided over and below the oxide semiconductor film will be described with reference to cross-sectional views.

First, a first conductive layer is formed over a substrate 100 having an insulating surface, and patterning (first patterning) is performed with use of a first photomask, so that a gate wiring including a first gate electrode 101, a capacitor wiring, a terminal electrode, and the like are formed (see FIG. 1A). As the substrate 100 having an insulating surface, any glass substrate used in the electronics industry (also referred to as an alkali-free glass substrate) such as an aluminosilicate glass substrate, an aluminoborosilicate glass substrate, or a barium borosilicate glass substrate; a plastic substrate with heat resistance which can withstand a process temperature in this manufacturing process; or the like can be used. In the case where the substrate 100 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

For the first gate electrode 101, a conductive layer having a single-layer structure or a stacked-layer structure can be formed using a metal material such as molybdenum, titanium, chromium, tantalum, tungsten, aluminum, copper, neodymium, or scandium, or an alloy material including any of these materials as a main component. In this embodiment, a 100-nm-thick single layer formed using tungsten is used as an example.

For example, in the case where the first gate electrode 101 has a stacked-layer structure, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. Alternatively, a stacked-layer structure in which a copper oxide layer containing Ca, which serves as a barrier layer is stacked over a copper layer containing Ca, or a stacked-layer structure in which a copper oxide layer containing Mg, which serves as a barrier layer is stacked over a copper layer containing Mg, can be employed. As a three-layer structure, it is preferable to stack a tungsten layer or a tungsten nitride layer, a layer of an alloy of aluminum and silicon or an alloy of aluminum and titanium, and a titanium nitride layer or a titanium layer.

Note that patterning is to process a shape of a film (layer), which means a process for forming a mask pattern (also referred to as a light-blocking pattern) of a film by a photolithography process including a series of steps such as formation of a photoresist, light exposure, development, an etching step, a resist removal step, cleaning, and inspection. That is, patterning means processing a layer into a desired shape by removal of an unnecessary part of the layer formed over a substrate.

Note that a photoresist is not necessarily applied over an entire surface of the film to be processed. Alternatively, a pattern bigger than a mask pattern to be formed may be formed by a screen printing method or an ink-jet method in advance. A photoresist is formed in advance into a pattern bigger than a mask pattern to be formed and the photoresist is processed into a desired shape by a photolithography process or the like, whereby the amount of photoresist which is removed by development can be reduced. Therefore, cost reduction in manufacturing a semiconductor device can be achieved.

An insulating film may be formed between the substrate 100 and the gate electrode 101. The insulating film is formed to have a single layer or a stacked layer by a method such as a CVD method, a plasma CVD method, a sputtering method, or a spin coating method using an oxide material or a nitride material including silicon. The insulating film is not necessarily provided, but when provided, it has an effect of blocking contaminants diffused from the substrate 100.

Next, a first gate insulating film 111 (also referred to as a first insulating film) covering the first gate electrode 101 is formed. The first gate insulating film 111 is formed to a thickness of 50 nm to 400 nm by a sputtering method, a PCVD method, or the like. For example, the first gate insulating film 111 can be formed of a silicon oxide film, a silicon nitride film, a silicon oxynitride film, or a silicon nitride oxide film. In this embodiment, an oxynitride silicon film with a thickness of 100 nm is used as an example. Note that the gate insulating film can be formed to have a two-layer structure using any of a silicon oxide film, a silicon nitride film, a silicon oxynitride film, and a silicon nitride oxide film, instead of a single-layer structure. Alternatively, a three-layer structure may be employed. Further, the first gate insulating film 111 can be formed using, for example, a metal compound such as aluminum oxide, magnesium oxide, aluminum nitride, yttrium oxide, or hafnium oxide.

Here, a silicon oxynitride film refers to a film which contains much oxygen than nitrogen, and in the case where measurement is performed using Rutherford backscattering spectrometry (RBS) and hydrogen forward scattering (HFS), contains oxygen, nitrogen, silicon, and hydrogen at concentrations ranging from 55 to 70 at. %, 0.5 to 15 at. %, 25 to 35 at. %, and 0.1 to 10 at. %, respectively. Further, a silicon nitride oxide film refers to a film which contains much nitrogen than oxygen and contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Next, a conductive layer (also referred to as a second conductive layer) is formed over the first gate insulating film 111, using a metal material by a sputtering method or a vacuum evaporation method. Patterning (second patterning) is performed with use of a second photomask, so that a signal line including a wiring layer 112 serving as source and drain electrodes, a capacitor wiring, a terminal electrode, and the like are formed (see FIG. 1B). In this embodiment, a 100-nm-thick titanium film is used as a second conductive layer as an example. As a material for the conductive film, an element selected from Al, Cr, Ta, Ti, Mo, and W; an alloy containing any of the above elements as its component; an alloy film containing a combination of any of the above elements; and the like can be given. Further, for heat treatment at 200° C. to 600° C., the conductive film preferably has heat resistance for such heat treatment. Since use of Al alone brings disadvantages such as low heat resistance and a tendency to be corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc); an alloy containing any of these above elements as a component; an alloy containing these elements in combination; and a nitride containing any of these above elements as a component.

Here, the conductive film has a layered structure including an Al film and a Ti film. Alternatively, the conductive film may be a single layer of a titanium film. Still alternatively, the conductive film may have a three-layer structure including a Ti film, an aluminum film containing Nd (Al—Nd film) which is stacked on the Ti film, and a Ti film formed on these films. The conductive film may have a single-layer structure of an aluminum film containing silicon.

Next, an oxide semiconductor film 121 (also referred to as a first oxide semiconductor film) is formed over the first gate insulating film 111 and the wiring layer 112. The thickness of the oxide semiconductor film 121 is set to from 5 nm to 200 nm inclusive, preferably, from 5 nm to 50 nm inclusive, and more preferably, from 10 nm to 30 nm inclusive. Reduction in the thickness of the oxide semiconductor film 121 enables variation in TFT characteristics (such as threshold voltage) to be decreased. In this embodiment, as the oxide semiconductor film 121, a first In—Ga—Zn—O-based non-single-crystal film (also referred to as an In—Ga—Zn—O-based non-single-crystal film) is formed to a thickness of 100 nm Here, the In—Ga—Zn—O-based non-single-crystal film is formed in an argon atmosphere or an oxygen atmosphere under the conditions where the target is an oxide semiconductor target including In (indium), Ga (gallium), and Zn (zinc) ($In_2O_3$:$Ga_2O_3$:$ZnO$=1:1:1) with a diameter of 8 inches, the distance between the substrate and the target is set at 170 mm, the pressure is set at 0.4 Pa, and the direct current (DC) power supply is set at 0.5 kW. Note that a pulse direct current (DC) power supply is preferable because dust can be reduced and the film thickness can be uniform.

In the case where the In—Ga—Zn—O-based oxide semiconductor film 121 is formed by a sputtering method, the oxide semiconductor target including In, Ga, and Zn may include an insulating impurity such as silicon oxide. Inclusion of the insulating impurity in the oxide semiconductor makes the oxide semiconductor film to be formed have an amorphous structure. In addition, when the oxide semiconductor film 121 is subjected to heat treatment in a later step, crystallization due to the heat treatment can be suppressed.

The oxide semiconductor film 121 can be formed using zinc oxide (ZnO) doped with an impurity element in an amorphous state, a polycrystalline state, or a microcrystalline state in which both amorphous and polycrystalline states exist. The impurity element is one or more types of impurity elements selected from: a Group 1 element (e.g., lithium (Li), sodium (Na), potassium (K), rubidium (Rb), or cesium (Cs)), a Group 13 element (e.g., boron (B), gallium (Ga), indium (In), or thallium (Tl)), a Group 14 element (e.g., carbon (C), silicon (Si), germanium (Ge), tin (Sn), or lead (Pb)), a Group 15 element (e.g., nitrogen (N), phosphorus (P), arsenic (As), antimony (Sb), or bismuth (Bi)), a Group 17 element (e.g., fluorine (F), chlorine (CO, bromine (Br), or iodine (I)), and the like. Alternatively, zinc oxide (ZnO) in an amorphous, polycrystalline, or microcrystalline state, to which none of impurity elements is added can also be used. As a specific example, any of the following can be used: $InGaO_3(ZnO)_5$, magnesium zinc oxide ($Mg_xZn_{1-x}$), cadmium zinc oxide ($Cd_xZn_{1-x}O$), cadmium oxide (CdO), an In—Ga—Zn—O-based amorphous oxide semiconductor (a-IGZO), or an In—Sn—Zn—O-based oxide semiconductor, a Ga—Sn—Zn—O-based oxide semiconductor, an In—Zn—O-based oxide semiconductor, a Sn—Zn—O-based oxide semiconductor, an In—Sn—O-based oxide semiconductor, or a Ga—Zn—O-based oxide semiconductor. Note that an oxide semiconductor typified by the In—Ga—Zn—O-based non-single-crystal film is a material having a wide energy gap (Eg); therefore, even if two gate electrodes are provided over and below an oxide semiconductor film, an increase in off current can be suppressed, which is preferable.

Further, as the oxide semiconductor film, an oxide semiconductor film including silicon oxide which is obtained by a sputtering method using an oxide semiconductor target including $SiO_x$ may be used. Typically, an oxide semiconductor target including $SiO_2$ at 0.1 wt % to 20 wt % inclusive, preferably at 1 wt % to 6 wt % inclusive may be used for film formation so that the oxide semiconductor film to be formed can include $SiO_x$ (X>0) which inhibits crystallization. Thus, a thin film transistor can be realized, whose gate threshold voltage at which a channel is formed is positive and as close to 0 V as possible.

Next, a second insulating film 122 is formed over the oxide semiconductor film 121. The second insulating film 122 is formed to have a thickness of from 5 nm to 3000 nm inclusive by a sputtering method, a PCVD method, or the like, and a silicon oxide film, a silicon nitride film, a silicon oxynitride film, or a silicon nitride oxide film can be used. In this embodiment, a 100-nm-thick oxynitiride silicon film is used as an example. Note that the second insulating film 122 can be formed to have a two-layer structure of a silicon oxide film, a silicon nitride film, a silicon oxynitride film, or a silicon nitride oxide film, instead of a single-layer structure. Alternatively, a three-layer structure may be employed. Further, the second insulating film 122 can be formed using, for example, a metal compound such as aluminum oxide, magnesium oxide, aluminum nitride, yttrium oxide, or hafnium oxide. When the second insulating film 122 is formed using the same material as that of the first gate insulating film 111, the same film-formation apparatus can be used, whereby reduction in cost can be achieved. Note that the second insulating film 122 is preferably formed to have a thickness of from 5 nm to 200 nm inclusive in order to reduce variation in TFT characteristics.

Figure 1B:
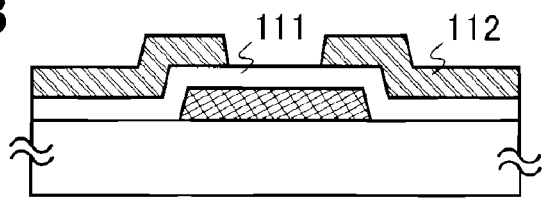
Figure 1C:
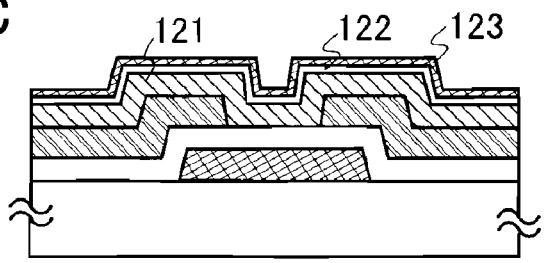

Next, a third conductive layer 123 is formed over the second insulating film 122 (see FIG. 1C). The third conductive layer 123 is formed to a thickness of from 5 nm to 1000 nm inclusive, by a sputtering method, a vacuum evaporation method, or the like. In this embodiment, a 100-nm-thick titanium film is used as an example. As a material of the third conductive layer 123, the same conductive film as that of the wiring layer 112 can be used.

Figure 1D:
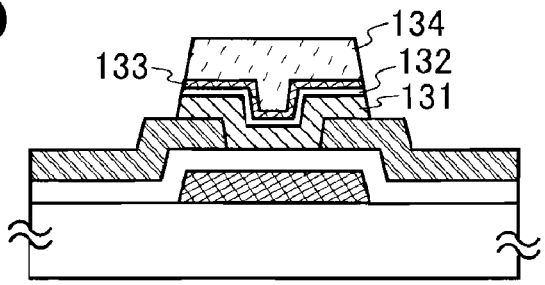

Next, a resist is formed over the third conductive layer 123, and exposure and development treatments are performed with use of a third photomask to form a resist mask. Then, with use of the resist mask obtained by the exposure and development treatments, the oxide semiconductor film 121, the second insulating film 122, and the third conductive layer 123 are etched (see FIG. 1D). Note that etching here is not limited to wet etching but may be dry etching. Dry etching can make the oxide semiconductor film 121, the second insulating film 122, and the third conductive layer 123 to be processed to have cross sections in tapered shapes. Accordingly, an island-shaped oxide semiconductor film 131 (also referred to as an island-shaped first oxide semiconductor film), an island-shaped second gate insulating film 132 (also referred to as an island-shaped second insulating film) over the island-shaped oxide semiconductor film 131, and a second gate electrode 133 over the island-shaped second gate insulating film 132 are provided, and a resist mask 134 is left over the second gate electrode 133 (see FIG. 1D). Note that the resist mask 134 over the second gate electrode 133 is removed through a resist removal step, a cleaning step, and the like performed later. The island-shaped oxide semiconductor film 131, the island-shaped second gate insulating film 132, and the second gate electrode 133 are formed in the same etching step, whereby end portions thereof are aligned with each other as illustrated in FIG. 1D and a continuous structure is provided. When the resist mask 134 is formed to have a cross section in a tapered shape, disconnection of a wiring due to a step shape, short circuit, or the like can be prevented.

Note that in this specification, the term "island-shape" means a shape of a film formed by patterning, which is not extended over the substrate to be connected to a terminal which has electrical connection with the outside. An example of the island shaped film is a semiconductor layer of a TFT provided in a pixel.

In the case of FIG. 1D, after formation of the second insulating film 122 and the third conductive layer 123 in this order over the oxide semiconductor film 121, patterning (third patterning) is performed, so that the island-shaped oxide semiconductor film 131, the island-shaped second gate insulating film 132, and the second gate electrode 133 are formed. The manufacturing step illustrated in FIG. 1D brings such an advantage that damage to the surface of the island-shaped oxide semiconductor layer can be reduced. The damage to the surface of the oxide semiconductor is caused by performing treatment using a resist stripper or ashing treatment so as to remove the resist mask which is left after patterning of the oxide semiconductor film into the island-shaped oxide semiconductor film.

Further, in the cross section of FIG. 1D, it is preferable that the width of the second gate electrode 133 be larger than a space where the island-shaped oxide semiconductor film 131 is interposed between the wiring layers 112 (source and drain electrodes). This is because, if the second gate electrode 133 is formed to have a width larger than the space where the island-shaped oxide semiconductor film 131 is interposed between the wiring layers 112 (source and drain electrodes), an effect of blocking light toward the island-shaped oxide semiconductor film 131 can be increased. The In—Ga—Zn—O-based non-single-crystal film formed by a sputtering method has photosensitivity at a wavelength of 450 nm or lower. Thus, providing the second gate electrode 133 to serve as a light-blocking layer which blocks light at a wavelength of 450 nm or lower allows the thin film transistor including the oxide semiconductor film 131 to decrease variation in electric characteristics, which is preferable.

After the resist mask 134 is removed, heat treatment at 200° C. to 600° C., typically 300° C. to 500° C., is preferably performed. In this case, heat treatment is performed in a furnace at 350° C. for 1 hour in a nitrogen atmosphere including oxygen. Through this heat treatment, rearrangement at the atomic level occurs in the first In—Ga—Zn—O-based non-single-crystal film. Because strain energy which inhibits carrier movement is released by the heat treatment, the heat treatment (including optical annealing) is important. There is no particular limitation on when to perform the heat treatment as long as it is performed after the formation of the first In—Ga—Zn—O-based non-single-crystal film. In this embodiment, the island-shaped oxide semiconductor film 131 can be covered with the island-shaped second gate insulating film 132; that is, deterioration in the first In—Ga—Zn—O-based non-single-crystal film after heat treatment can be reduced, which is preferable.

Figure 1E:
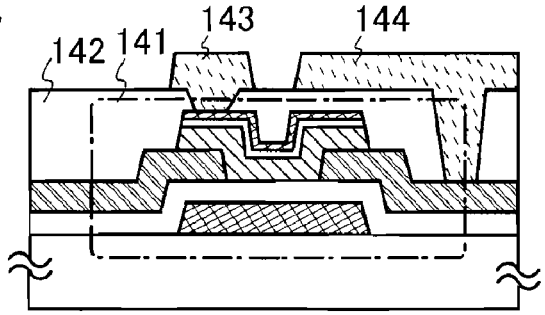

Through the above steps, a thin film transistor 141 is completed, and then a resin layer 142 serving as an interlayer insulating layer is formed so as to cover the thin film transistor 141. Then, fourth patterning is performed on the resin layer 142, so that an opening portion reaching the second gate electrode 133 and an opening portion reaching the wiring layer 112 are formed. After that, a conductive material is formed over the resin layer 142 serving as an interlayer insulating layer, and fifth patterning is performed, whereby a lead wiring 143 connected to the second gate electrode 133 and a pixel electrode 144 connected to the wiring layer 112 are formed (see FIG. 1E).

Note that the resin layer 142 is formed to a thickness within the range of from 0.5 μm to 3 μm. As a material for the resin layer 142, a photosensitive or non-photosensitive organic material such as polyimide, acrylic, polyamide, polyimide-amide, or benzocyclobutene is used, or a stack of any of these materials is used. Here, photosensitive polyimide is provided by a coating method and then subjected to exposure, development, and baking treatments to form the resin layer 142 with a flat surface and a thickness or 1.5 μm. Formation of the layer from polyimide by a coating method enables the number of steps to be reduced. In addition, the resin layer 142 also serves as a protective insulating layer which prevents moisture, hydrogen, or the like from entering the island-shaped oxide semiconductor film 131.

In the resin layer 142, the opening portion (contact hole) through which the lead wiring 143 and the second gate electrode 133 are electrically connected and the opening portion (contact hole) through which the pixel electrode 144 and the wiring layer 112 are electrically connected are formed with use of a fourth photomask. Then, the conductive material is formed over the resin layer 142 and in the contact holes, and patterning is performed with a fifth photomask, so that the lead wiring 143 and the pixel electrode 144 are formed.

The lead wiring 143 connects the second gate electrode 133 to a wiring which controls potential of the second gate electrode 133. Therefore, the lead wiring 143 may be extended to a terminal to which fixed potential is input; alternatively, the lead wiring may be formed to electrically connect the first gate electrode and the second gate electrode by formation of a contact hole reaching the first gate electrode. In the case where the second gate electrode 133 and the first gate electrode 101 have different potential from each other, the opening for electrical connection of the second gate electrode 133 and the first gate electrode 101 is not required. The lead wiring 143 and the pixel electrode 144 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added. Note that the lead wiring 143 and the pixel electrode 144 may have a layered structure using the same material as that of the wiring layer 112.

As described above, in the manufacturing method of a semiconductor device described in this embodiment, gate electrodes are provided over and below the channel formation region including an oxide semiconductor. Thus, an increase of the number of processes is suppressed regardless of an increase of the number of layers to be stacked. Therefore, shortening of the manufacturing process and reduction in cost can be achieved. In addition, the second gate electrode controls potential, whereby the threshold voltage can be controlled. In the manufacturing method of a semiconductor device in this embodiment, the second insulating film can be formed over the oxide semiconductor film which has not been subjected to patterning yet. Accordingly, a step shape due to the thickness of the oxide semiconductor film is not formed in the second insulating film. As a result, the thickness of the second insulating film can be easily reduced. Therefore, by controlling the potential of the second gate electrode, the potential which is necessary for controlling the threshold voltage of the thin film transistor can be set to be low.

This embodiment can be implemented in appropriate combination with the structures described in the other embodiments.

Embodiment 2

In this embodiment, a method for manufacturing a semiconductor device including a thin film transistor including an oxide semiconductor film which is sandwiched between two gate electrodes provided over and below the oxide semiconductor film will be described with reference to cross-sectional views different from those of Embodiment 1.

A structure formed through the steps illustrated in FIGS. 2A to 2E is partly different from that of FIGS. 1A to 1E. In FIGS. 2A to 2E, the same portions with FIGS. 1A to 1E are denoted by the same reference numerals, and description of the above embodiment applies here as for detailed description.

FIGS. 2A to 2E illustrate an example in which a second oxide semiconductor film serving as a buffer layer is formed over the wiring layer 112 of FIG. 1B. The same description of FIG. 1A can be applied to FIG. 2A.

Figure 2A:
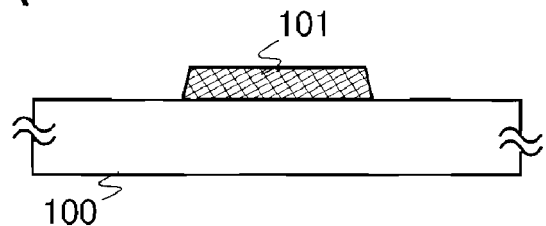
FIGS. 2A to 2E are cross-sectional views of one embodiment of the present invention.
Figure 2B:
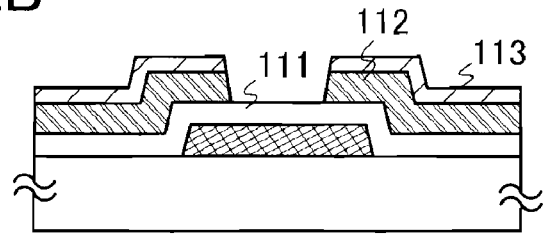

The structure illustrated in FIG. 2B is described. A conductive layer (the second conductive layer) is formed using a metal material over the first gate insulating film 111 by a sputtering method or a vacuum evaporation method; an oxide semiconductor film is formed over the conductive layer by a sputtering method; and patterning (second patterning) is performed with use of a second photomask, so that the wiring layer 112 serving as source and drain electrodes, an oxide semiconductor film 113 (also referred to as a second oxide semiconductor film or a low resistance oxide semiconductor film), a capacitor wiring, a terminal electrode, and the like are formed (see FIG. 2B). In this embodiment, as the second oxide semiconductor film that is to be the oxide semiconductor film 113, an oxynitride film including indium, gallium, and zinc is formed by a sputtering method in an atmosphere including a nitrogen gas, with use of an oxide semiconductor target including In (indium), Ga (gallium), and Zn (zinc) ($In_2O_3:Ga_2O_3:ZnO=1:1:1$). By heat treatment performed in the later step, this oxynitride film becomes an oxide semiconductor film (also referred to as a second In—Ga—Zn—O-based non-single-crystal film) with resistance lower than the In—Ga—Zn—O-based non-single-crystal-film that is the first oxide semiconductor film.

For the low-resistance oxide semiconductor film, a degenerate oxide semiconductor is preferably used. The degenerate oxide semiconductor preferably transmits light. As an example of a low-resistance oxide semiconductor film, an In—Ga—Zn—O-based non-single-crystal film including nitrogen, that is, an In—Ga—Zn—O—N-based non-single-crystal film (also referred to as an IGZON film) may be used. Alternatively, a Ga—Zn—O-based non-single-crystal film or a Ga—Zn—O-based non-single-crystal film including nitrogen, that is, a Ga—Zn—O-N-based non-single-crystal film may be used. Further alternatively, an Al—Zn—O-based non-single-crystal film or an Al—Zn—O-based non-single-crystal film including nitrogen, that is, an Al—Zn—O-N-based non-single-crystal film may be used for the low-resistance oxide semiconductor film. Note that each of the Ga—Zn—O-based oxide semiconductor and the Ga—Zn—O-N-based oxide semiconductor preferably includes gallium at 1 wt % to 10 wt % inclusive, and each of the Al—Zn—O-based oxide semiconductor and the Al—Zn—O-N-based oxide semiconductor preferably includes aluminum at 1 wt % to 10 wt % inclusive. Further alternatively, a Zn—O-N-based non-single-crystal film including nitrogen or a Sn—Zn—O-N-based non-single-crystal film including nitrogen may be used.

Figure 2C:
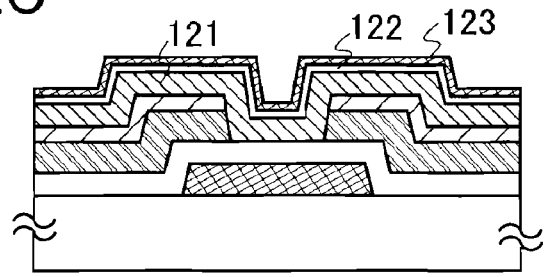

Next, in a manner similar to the case of FIG. 1C, the oxide semiconductor film 121, the second insulating film 122, and the third conductive layer 123 are formed in this order over the first gate insulating film 111 and the oxide semiconductor film 113 (see FIG. 2C).

Figure 2D:
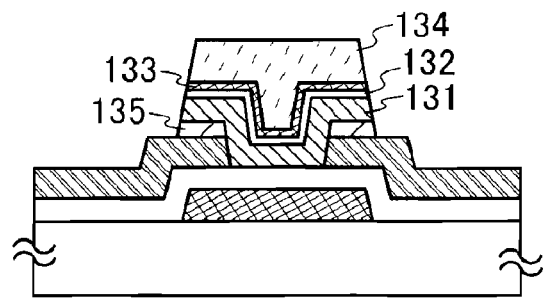
Figure 2E:
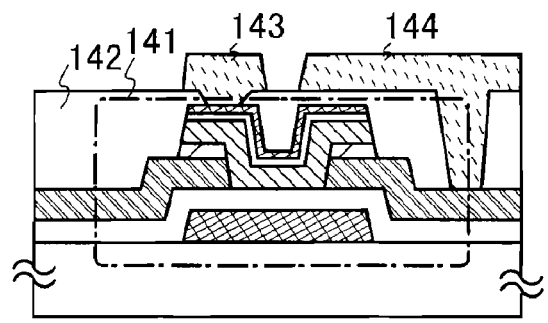

Next, in a manner similar to the case of FIG. 1D, a resist is formed over the third conductive layer 123, and exposure and development treatments are performed with use of a third photomask to form a resist mask. Then, with use of the resist mask obtained by the exposure and development treatments, the oxide semiconductor film 113 (the second oxide semiconductor film), the oxide semiconductor film 121 (the first oxide semiconductor film), the second insulating film 122, and the third conductive layer 123 are etched (see FIG. 2D). Accordingly, the island-shaped oxide semiconductor film 131, a buffer layer 135 (also referred to as a low resistance region, $N^+$ region, or $n^+$ region) below the island-shaped oxide semiconductor film 131, the island-shaped second gate insulating film 132 (also referred to as the second insulating film) over the island-shaped oxide semiconductor film 131, and the second gate electrode 133 over the island-shaped second gate insulating film 132 are provided. In addition, the resist mask 134 is left over the second gate electrode 133 (see FIG. 2D). Note that the buffer layer 135, the island-shaped oxide semiconductor film 131, the island-shaped second gate insulating film 132, and the second gate electrode 133 are formed in the same etching step, whereby end portions thereof are aligned with each other as illustrated in FIG. 2D and a continuous structure is provided. When the resist mask 134 is formed to have a cross section in a tapered shape, disconnection of a wiring due to a step shape, short circuit, or the like can be prevented.

After the resist mask 134 is removed, heat treatment at 200° C. to 600° C., typically 300° C. to 500° C., is preferably performed. In this case, heat treatment is performed in a furnace at 350° C. for 1 hour in a nitrogen atmosphere including oxygen. Through this heat treatment, rearrangement at the atomic level occurs in the In—Ga—Zn—O-based non-single-crystal film that is the first oxide semiconductor film and the In—Ga—Zn—O-based non-single-crystal film that is the second oxide semiconductor film. Because strain energy which inhibits carrier movement is released by the heat treatment, the heat treatment (including optical annealing) is important. There is no particular limitation on when to perform the heat treatment as long as it is performed after the formation of the first oxide semiconductor film and the second oxide semiconductor film.

Through the above steps, the thin film transistor 141 is completed, and then the resin layer 142 serving as an interlayer insulating layer is formed so as to cover the thin film transistor 141. In a manner similar to the case of FIG. 1E, with use of fourth and fifth photomasks, the resin layer 142 which covers the thin film transistor 141 and serves as an interlayer insulating layer is formed, and an opening portion reaching the second gate electrode 133 and an opening portion reaching the wiring layer 112 are formed in the resin layer 142 serving as an interlayer insulating layer. After that, a conductive material is formed over the resin layer 142 serving as an interlayer insulating layer, and a lead wiring 143 connected to the second gate electrode 133 and a pixel electrode 144 connected to the wiring layer 112 are formed (see FIG. 2E).

This embodiment can be implemented in appropriate combination with the structures described in the other embodiments. As in the above embodiment, this embodiment relates to a manufacturing method of a semiconductor device, in which gate electrodes are provided over and below the channel formation region including an oxide semiconductor; increase of the number of processes is suppressed regardless of increase of the number of layers to be stacked. Therefore, shortening of the manufacturing process and reduction in cost can be achieved. In addition, the second gate electrode controls potential, whereby the threshold voltage can be controlled. In the manufacturing method of a semiconductor device in this embodiment, the second insulating film can be formed over the oxide semiconductor film which has not been subjected to patterning yet. Accordingly, a step shape due to the thickness of the oxide semiconductor film is not formed in the second insulating film. As a result, the thickness of the second insulating film can be easily reduced. Therefore, by controlling the potential of the second gate electrode, the potential which is necessary for controlling the threshold voltage of the thin film transistor can be set to be low.

Embodiment 3

In this embodiment, a method for manufacturing a semiconductor device including a thin film transistor including an oxide semiconductor film which is sandwiched between two gate electrodes provided over and below the oxide semiconductor film will be described with reference to cross-sectional views different from those of Embodiments 1 and 2.

A structure formed through the steps illustrated in FIGS. 3A to 3E is partly different from those of FIGS. 1A to 1E and FIGS. 2A to 2E. In FIGS. 3A to 3E, the same portions with FIGS. 1A to 1E and FIGS. 2A to 2E are denoted by the same reference numerals, and description of the above embodiment applies here as for detailed description.

FIGS. 3A to 3E illustrate an example in which a second oxide semiconductor film serving as a buffer layer is formed below the wiring layer 112 of FIG. 1B. The same description of FIG. 1A can be applied to FIG. 3A.

Figure 3A:
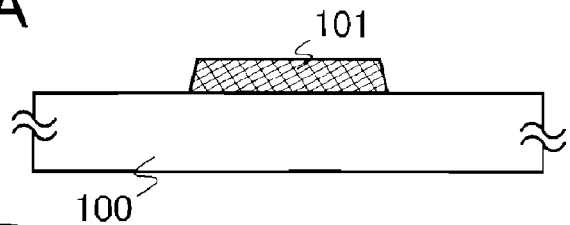
FIGS. 3A to 3E are cross-sectional views of one embodiment of the present invention.
Figure 3B:
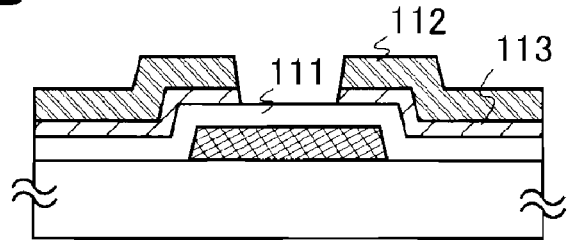

The structure illustrated in FIG. 3B is described. An oxide semiconductor film is formed over the first gate insulating film 111 by a sputtering method, a conductive layer (the second conductive layer) is formed using a metal material over the oxide semiconductor film by a sputtering method or a vacuum evaporation method, and patterning (second patterning) is performed with use of a second photomask, so that a signal line including the wiring layer 112 serving as source and drain electrodes, the oxide semiconductor film 113 (also referred to as a second oxide semiconductor film, a low-resistance oxide semiconductor film, or a buffer layer), a capacitor wiring, a terminal electrode, and the like are formed (see FIG. 3B). In this embodiment, as the second oxide semiconductor film to be the oxide semiconductor film 113, an oxynitride film including indium, gallium, and zinc is formed by a sputtering method in an atmosphere including a nitrogen gas, with use of an oxide semiconductor target including In (indium), Ga (gallium), and Zn (zinc) ($In_2O_3$:$Ga_2O_3$:$ZnO$=1:1:1). By heat treatment performed in the later step, this oxynitride film becomes an oxide semiconductor film (also referred to as a second In—Ga—Zn—O-based non-single-crystal film) with resistance lower than the In—Ga—Zn—O-based non-single-crystal-film that is the first oxide semiconductor film.

Figure 3C:
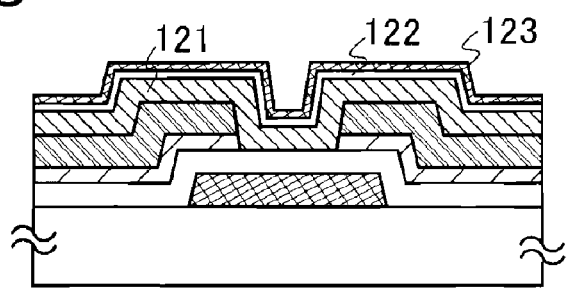

Next, in a manner similar to the case of FIG. 1C, the oxide semiconductor film 121 (the first oxide semiconductor film), the second insulating film 122, and the third conductive layer 123 are formed in this order over the first gate insulating film 111 and the wiring layer 112 (see FIG. 3C).

Figure 3D:
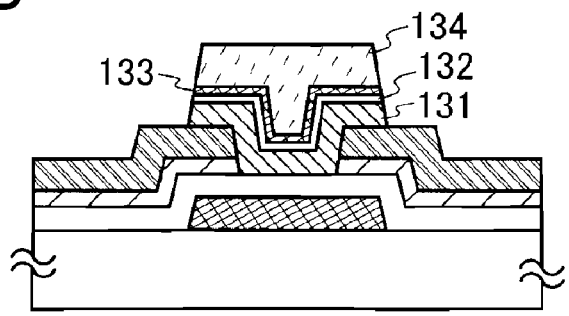
Figure 3E:
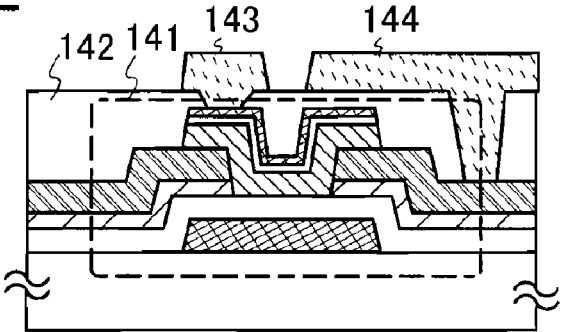

Next, in a manner similar to the case of FIG. 1D, a resist is formed over the third conductive layer 123, and exposure and development treatments are performed with use of a third photomask to form a resist mask. Then, with use of the resist mask obtained by the exposure and development treatments, the oxide semiconductor film 121, the second insulating film 122, and the third conductive layer 123 are etched (see FIG. 3D). Accordingly, the island-shaped oxide semiconductor film 131, the island-shaped second gate insulating film 132 over the island-shaped oxide semiconductor film 131, and the second gate electrode 133 over the island-shaped second gate insulating film 132 are provided. In addition, the resist mask 134 is left over the second gate electrode 133 (see FIG. 3D). Note that the island-shaped oxide semiconductor film 131, the island-shaped second gate insulating film 132, and the second gate electrode 133 are formed in the same etching step, whereby end portions thereof are aligned with each other as illustrated in FIG. 3D and a continuous structure is provided. When the resist mask 134 is formed to have a cross section in a tapered shape, disconnection of a wiring due to a step shape, short circuit, or the like can be prevented.

After the resist mask 134 is removed, heat treatment at 200° C. to 600° C., typically 300° C. to 500° C., is preferably performed. In this case, heat treatment is performed in a furnace at 350° C. for 1 hour in a nitrogen atmosphere including oxygen. Through this heat treatment, rearrangement at the atomic level occurs in the In—Ga—Zn—O-based non-single-crystal film that is the first oxide semiconductor film and the In—Ga—Zn—O-based non-single-crystal film that is the second oxide semiconductor film. Because strain energy which inhibits carrier movement is released by the heat treatment, the heat treatment (including optical annealing) is important. There is no particular limitation on when to perform the heat treatment as long as it is performed after the formation of the first oxide semiconductor film and the second oxide semiconductor film.

Through the above steps, the thin film transistor 141 is completed. Then, in a manner similar to the case of FIG. 1E, with use of fourth and fifth photomasks, the resin layer 142 which covers the thin film transistor 141 and serves as an interlayer insulating layer is formed and, opening portions are formed in the resin layer 142 serving as an interlayer insulating layer. After that, a conductive material is formed over the resin layer 142 serving as an interlayer insulating layer, and a lead wiring 143 connected to the second gate electrode 133 and a pixel electrode 144 connected to the wiring layer 112 are formed (see FIG. 3E).

This embodiment can be implemented in appropriate combination with the structures described in the other embodiments. As in the above embodiment, this embodiment relates to a manufacturing method of a semiconductor device, in which gate electrodes are provided over and below the channel formation region including an oxide semiconductor; increase of the number of processes is suppressed regardless of increase of the number of layers to be stacked. Therefore, shortening of the manufacturing process and reduction in cost can be achieved. In addition, the second gate electrode controls potential, whereby the threshold voltage can be controlled. In the manufacturing method of a semiconductor device in this embodiment, the second insulating film can be formed over the oxide semiconductor film which has not been subjected to patterning yet. Accordingly, a step shape due to the thickness of the oxide semiconductor film is not formed in the second insulating film. As a result, the thickness of the second insulating film can be easily reduced. Therefore, by controlling the potential of the second gate electrode, the potential which is necessary for controlling the threshold voltage of the thin film transistor can be set to be low.

Embodiment 4

In this embodiment, a method for manufacturing a semiconductor device including a thin film transistor including an oxide semiconductor film which is sandwiched between two gate electrodes provided over and below the oxide semiconductor film will be described with reference to cross-sectional views different from those of Embodiment 1.

A structure formed through the steps illustrated in FIGS. 4A to 4E is partly different from those of FIGS. 1A to 1E. In FIGS. 4A to 4E, the same portions with FIGS. 1A to 1E are denoted by the same reference numerals, and description of the above embodiment applies here as for detailed description.

FIGS. 4A to 4E illustrate an example in which a channel protective film is formed between the oxide semiconductor film 121 and the second insulating film 122 of FIG. 1B. The same description of FIG. 1A and FIG. 1B can be applied to FIG. 4A and FIG. 4B, respectively.

Figure 4A:
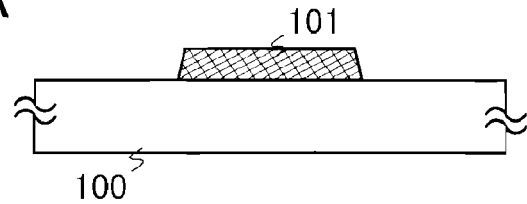
FIGS. 4A to 4E are cross-sectional views of one embodiment of the present invention.
Figure 4B:
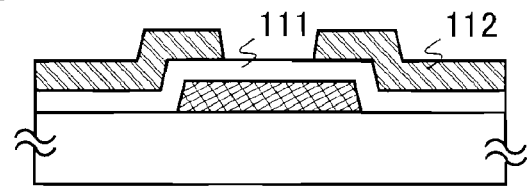
Figure 4C:
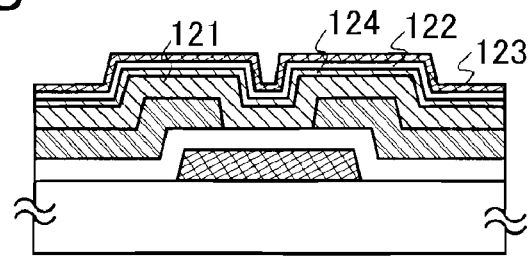

In FIG. 4C, the oxide semiconductor film 121, a channel protective film 124, the second insulating film 122, and the third conductive layer 123 are formed in this order over the first gate insulating film 111 and the wiring layer 112. In this embodiment, the channel protective film 124 may be formed using an inorganic insulating material as an example. Further, without limitation to the inorganic insulating material, an amorphous semiconductor film obtained by a sputtering method or a compound thereof, typically, an amorphous silicon film may be used. A compound of an amorphous silicon film used for the channel protective film 124 refers to a p-type amorphous silicon film formed by a sputtering method, which includes a p-type impurity element such as boron, or an n-type amorphous silicon film formed by a sputtering method, which includes an n-type impurity element such as phosphorus. In particular, in the case of using a p-type amorphous silicon film for the channel protective film 124, an effect of reducing leakage current in an off state and cancelling carriers (electrons) generated on the back channel side of the oxide semiconductor film provided in contact with the p-type amorphous silicon film is obtained. In the case where an amorphous silicon film is used as the channel protective film 124, the amorphous silicon film has a blocking function against moisture, hydrogen ions, OH$^-$, or the like. In addition, the amorphous silicon film functions as a light-blocking layer for blocking incidence of light to the oxide semiconductor.

In this embodiment, an amorphous silicon film including boron which is obtained by a sputtering method using a target including boron is used as the channel protective film 124. The amorphous silicon film including boron is formed in a low power condition or a condition of a substrate temperature at lower than 200° C. Since the channel protective film 124 is provided to be in contact with the oxide semiconductor film 121, it is preferable that damage to the oxide semiconductor film 121 in film formation and etching of the channel protective film 124 be reduced as much as possible.

Figure 4D:
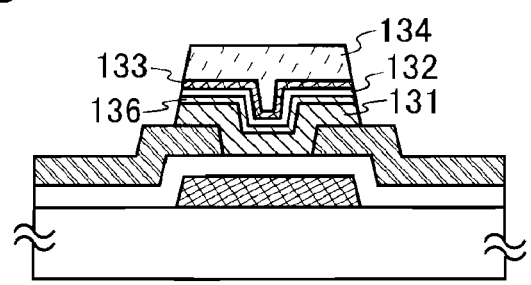
Figure 4E:
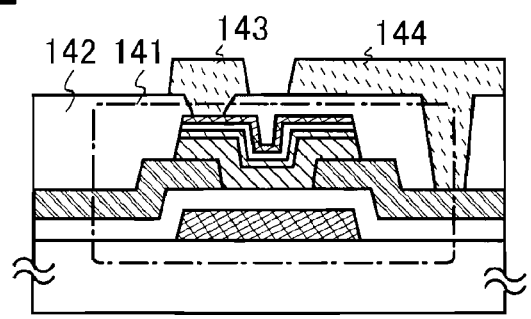

Next, in a manner similar to the case of FIG. 1D, a resist is formed over the third conductive layer 123, and exposure and development treatments are performed with use of a third photomask to form a resist mask. Then, with use of the resist mask obtained by the exposure and development treatments, the oxide semiconductor film 121, the channel protective film 124, the second insulating film 122, and the third conductive layer 123 are etched (see FIG. 4D). Accordingly, the island-shaped oxide semiconductor film 131 (also referred to as the island-shaped first oxide semiconductor film), an island-shaped channel protective film 136 over the island-shaped oxide semiconductor film 131, the island-shaped second gate insulating film 132 (also referred to as the island-shaped second insulating film) over the island-shaped channel protective film 136, and the second gate electrode 133 over the island-shaped second gate insulating film 132 are provided. In addition, the resist mask 134 is left over the second gate electrode 133 (see FIG. 4D). Note that the island-shaped oxide semiconductor film 131, the island-shaped channel protective film 136, the island-shaped second gate insulating film 132, and the second gate electrode 133 are formed in the same etching step, whereby end portions thereof are aligned with each other as illustrated in FIG. 4D and a continuous structure is provided. When the resist mask 134 is formed to have a cross section in a tapered shape, disconnection of a wiring due to a step shape, short circuit, or the like can be prevented.

After the resist mask 134 is removed, in a manner similar to the case of FIG. 1D, heat treatment at 200° C. to 600° C., typically 300° C. to 500° C., is preferably performed.

Through the above steps, the thin film transistor 141 is completed. Then, in a manner similar to the case of FIG. 1E, with use of fourth and fifth photomasks, the resin layer 142 serving as an interlayer insulating layer is formed to cover the thin film transistor 141. Then, contact holes are formed in the resin layer 142 serving as an interlayer insulating layer. After that, a conductive material is formed over the resin layer 142 serving as an interlayer insulating layer, and a lead wiring 143 connected to the second gate electrode 133 and a pixel electrode 144 connected to the wiring layer 112 are formed (see FIG. 4E).

This embodiment can be implemented in appropriate combination with the structures described in the other embodiments. As in the above embodiment, this embodiment relates to a manufacturing method of a semiconductor device, in which gate electrodes are provided over and below the channel formation region including an oxide semiconductor; increase of the number of processes is suppressed regardless of increase of the number of layers to be stacked. Therefore, shortening of the manufacturing process and reduction in cost can be achieved. In addition, the second gate electrode controls potential, whereby the threshold voltage can be controlled. In the manufacturing method of a semiconductor device in this embodiment, the second insulating film can be formed over the oxide semiconductor film which has not been subjected to patterning yet. Accordingly, a step shape due to the thickness of the oxide semiconductor film is not formed in the second insulating film. As a result, the thickness of the second insulating film can be easily reduced. Therefore, by controlling the potential of the second gate electrode, the potential which is necessary for controlling the threshold voltage of the thin film transistor can be set to be low.

Embodiment 5

In this embodiment, a method for manufacturing a semiconductor device including a thin film transistor including an oxide semiconductor film which is sandwiched between two gate electrodes provided over and below the oxide semiconductor film will be described with reference to cross-sectional views different from those of Embodiment 2.

A structure formed through the steps illustrated in FIGS. 5A to 5E is partly different from those of FIGS. 2A to 2E and FIGS. 4A to 4E. In FIGS. 5A to 5E, the same portions with FIGS. 2A to 2E and FIGS. 4A to 4E are denoted by the same reference numerals, and description of the above embodiment applies here as for detailed description.

FIGS. 5A to 5E illustrate an example in which a second oxide semiconductor film serving as a buffer layer is formed over the wiring layer 112 of FIG. 1B. The same description of FIG. 2A and FIG. 2B can be applied to FIG. 5A and FIG. 5B, respectively.

Figure 5A:
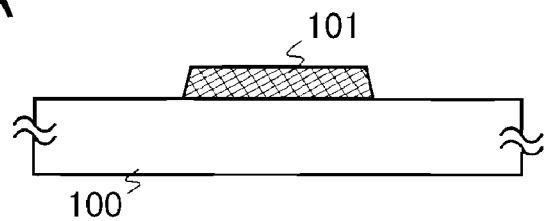
FIGS. 5A to 5E are cross-sectional views of one embodiment of the present invention.
Figure 5B:
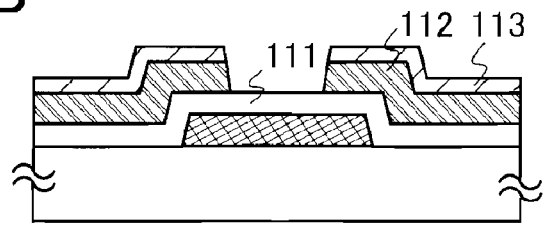
Figure 5C:
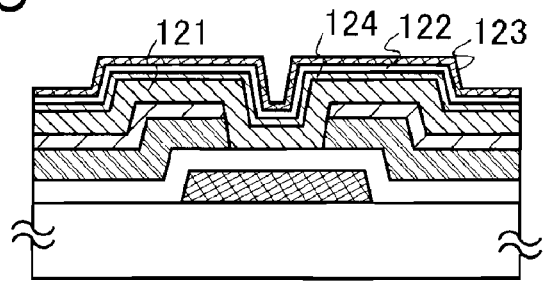

As in FIG. 4C, the oxide semiconductor film 121, the channel protective film 124, the second insulating film 122, and the third conductive layer 123 are formed in this order over the first gate insulating film 111 and the oxide semiconductor film 113 (see FIG. 5C).

Figure 5D:
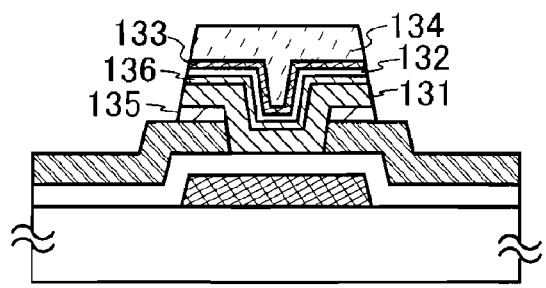
Figure 5E:
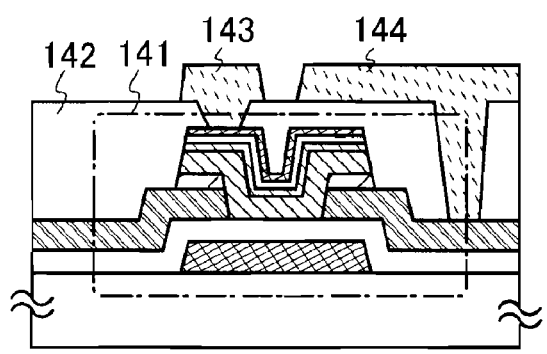

Next, in a manner similar to the case of FIG. 2D, a resist is formed over the third conductive layer 123, and exposure and development treatments are performed with use of a third photomask to form a resist mask. Then, with use of the resist mask obtained by the exposure and development treatments, the oxide semiconductor film 113 (the second oxide semiconductor film), the oxide semiconductor film 121 (the first oxide semiconductor film), the channel protective film 124, the second insulating film 122, and the third conductive layer 123 are etched (see FIG. 5D). Accordingly, the island-shaped oxide semiconductor film 131, a buffer layer 135 (also referred to as a low resistance region, $N^+$ region, or $n^+$ region) below the island-shaped oxide semiconductor film 131, the island-shaped channel protective film 136 over the island-shaped oxide semiconductor film 131, the island-shaped second gate insulating film 132 over the island-shaped channel protective film 136, and the second gate electrode 133 over the island-shaped second gate insulating film 132 are provided. In addition, the resist mask 134 is left over the second gate electrode 133 (see FIG. 5D). Note that the buffer layer 135, the island-shaped oxide semiconductor film 131, the island-shaped channel protective film 136, the island-shaped second gate insulating film 132, and the second gate electrode 133 are formed in the same etching step, whereby end portions thereof are aligned with each other as illustrated in FIG. 5D and a continuous structure is provided. When the resist mask 134 is formed to have a cross section in a tapered shape, disconnection of a wiring due to a step shape, short circuit, or the like can be prevented.

After the resist mask 134 is removed, heat treatment at 200° C. to 600° C., typically 300° C. to 500° C., is preferably performed. In this case, heat treatment is performed in a furnace at 350° C. for 1 hour in a nitrogen atmosphere including oxygen. Through this heat treatment, rearrangement at the atomic level occurs in the In—Ga—Zn—O-based non-single-crystal film that is the first oxide semiconductor film and the In—Ga—Zn—O-based non-single-crystal film that is the second oxide semiconductor film. Because strain energy which inhibits carrier movement is released by the heat treatment, the heat treatment (including optical annealing) is important. There is no particular limitation on when to perform the heat treatment as long as it is performed after the formation of the first oxide semiconductor film and the second oxide semiconductor film.

Through the above steps, the thin film transistor 141 is completed. Then, in a manner similar to the case of FIG. 2E, with use of fourth and fifth photomasks, the resin layer 142 serving as an interlayer insulating layer is formed to cover the thin film transistor 141. Then, an opening portion reaching the second gate electrode 133 and an opening portion reaching the wiring layer 112 are formed in the resin layer 142 serving as an interlayer insulating layer. After that, a conductive material is formed over the resin layer 142 serving as an interlayer insulating layer, and a lead wiring 143 connected to the second gate electrode 133 and a pixel electrode 144 connected to the wiring layer 112 are formed (see FIG. 5E).

This embodiment can be implemented in appropriate combination with the structures described in the other embodiments. As in the above embodiment, this embodiment relates to a manufacturing method of a semiconductor device, in which gate electrodes are provided over and below the channel formation region including an oxide semiconductor; increase of the number of processes is suppressed regardless of increase of the number of layers to be stacked. Therefore, shortening of the manufacturing process and reduction in cost can be achieved. In addition, the second gate electrode controls potential, whereby the threshold voltage can be controlled. In the manufacturing method of a semiconductor device in this embodiment, the second insulating film can be formed over the oxide semiconductor film which has not been subjected to patterning yet. Accordingly, a step shape due to the thickness of the oxide semiconductor film is not formed in the second insulating film. As a result, the thickness of the second insulating film can be easily reduced. Therefore, by controlling the potential of the second gate electrode, the potential which is necessary for controlling the threshold voltage of the thin film transistor can be set to be low.

Embodiment 6

In this embodiment, a method for manufacturing a semiconductor device including a thin film transistor including an oxide semiconductor film which is sandwiched between two gate electrodes provided over and below the oxide semiconductor film will be described with reference to cross-sectional views different from those of Embodiment 3.

A structure formed through the steps illustrated in FIGS. 6A to 6E is partly different from those of FIGS. 3A to 3E and FIGS. 4A to 4E. In FIGS. 6A to 6E, the same portions with FIGS. 3A to 3E and FIGS. 4A to 4E are denoted by the same reference numerals, and description of the above embodiment applies here as for detailed description.

FIGS. 6A to 6E illustrate an example in which an oxide semiconductor film 113 (also referred to as a low-resistance region or a buffer layer) that is a second In—Ga—Zn—O-based non-single-crystal film is formed below the wiring layer 112 of FIG. 3B. The same description of FIG. 3A and FIG. 3B can be applied to FIG. 6A and FIG. 6B, respectively.

Figure 6A:
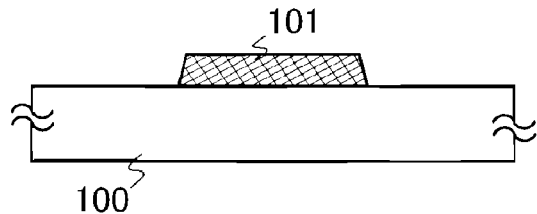
FIGS. 6A to 6E are cross-sectional views of one embodiment of the present invention.
Figure 6B:
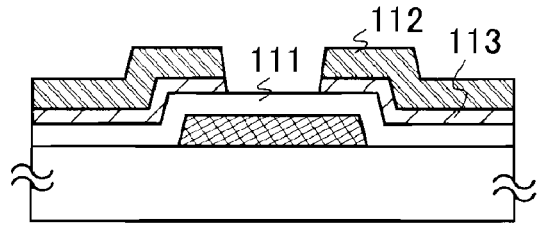
Figure 6C:
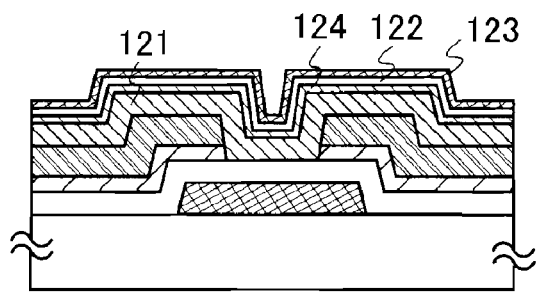

As in FIG. 4C, the oxide semiconductor film 121, the channel protective film 124, the second insulating film 122, and the third conductive layer 123 are formed in this order over the first gate insulating film 111 and the wiring layer 112 (see FIG. 6C).

Figure 6D:
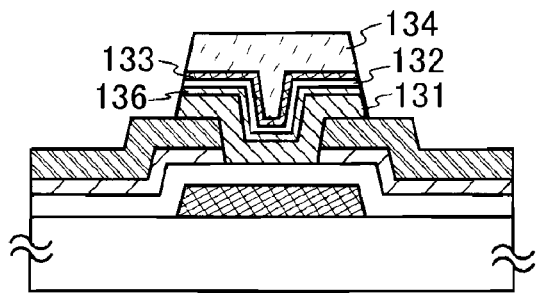
Figure 6E:
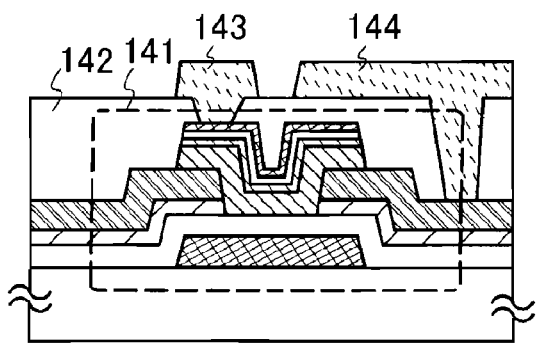

Next, in a manner similar to the case of FIG. 3D, a resist is formed over the third conductive layer 123, and exposure and development treatments are performed with use of a third photomask to form a resist mask. Then, with use of the resist mask obtained by the exposure and development treatments, the oxide semiconductor film 121, the channel protective film 124, the second insulating film 122, and the third conductive layer 123 are etched (see FIG. 6D). Accordingly, the island-shaped oxide semiconductor film 131, the island-shaped channel protective film 136 over the island-shaped oxide semiconductor film 131, the island-shaped second gate insulating film 132 over the island-shaped channel protective film 136, and the second gate electrode 133 over the island-shaped second gate insulating film 132 are provided. In addition, the resist mask 134 is left over the second gate electrode 133 (see FIG. 6D). Note that the island-shaped oxide semiconductor film 131, the island-shaped channel protective film 136, the island-shaped second gate insulating film 132, and the second gate electrode 133 are formed in the same etching step, whereby end portions thereof are aligned with each other as illustrated in FIG. 6D and a continuous structure is provided. When the resist mask 134 is formed to have a cross section in a tapered shape, disconnection of a wiring due to a step shape, short circuit, or the like can be prevented.

After the resist mask 134 is removed, heat treatment at 200° C. to 600° C., typically 300° C. to 500° C., is preferably performed. In this case, heat treatment is performed in a furnace at 350° C. for 1 hour in a nitrogen atmosphere including oxygen. Through this heat treatment, rearrangement at the atomic level occurs in the In—Ga—Zn—O-based non-single-crystal film that is the first oxide semiconductor film and the In—Ga—Zn—O-based non-single-crystal film that is the second oxide semiconductor film. Because strain energy which inhibits carrier movement is released by the heat treatment, the heat treatment (including optical annealing) is important. There is no particular limitation on when to perform the heat treatment as long as it is performed after the formation of the first oxide semiconductor film and the second oxide semiconductor film.

Through the above steps, the thin film transistor 141 is completed. Then, in a manner similar to the case of FIG. 3E, with use of fourth and fifth photomasks, the resin layer 142 serving as an interlayer insulating layer is formed to cover the thin film transistor 141. Then, opening portions are formed in the resin layer 142 serving as an interlayer insulating layer. After that, a conductive material is formed over the resin layer 142 serving as an interlayer insulating layer, and a lead wiring 143 connected to the second gate electrode 133 and a pixel electrode 144 connected to the wiring layer 112 are formed (see FIG. 6E).

This embodiment can be implemented in appropriate combination with the structures described in the other embodiments. As in the above embodiment, this embodiment relates to a manufacturing method of a semiconductor device, in which gate electrodes are provided over and below the channel formation region including an oxide semiconductor; increase of the number of processes is suppressed regardless of increase of the number of layers to be stacked. Therefore, shortening of the manufacturing process and reduction in cost can be achieved. In addition, the second gate electrode controls potential, whereby the threshold voltage can be controlled. In the manufacturing method of a semiconductor device in this embodiment, the second insulating film can be formed over the oxide semiconductor film which has not been subjected to patterning yet. Accordingly, a step shape due to the thickness of the oxide semiconductor film is not formed in the second insulating film. As a result, the thickness of the second insulating film can be easily reduced. Therefore, by controlling the potential of the second gate electrode, the potential which is necessary for controlling the threshold voltage of the thin film transistor can be set to be low.

Embodiment 7

In this embodiment, a display device will be described with reference to a block diagram, a circuit diagram, a waveform diagram showing potential changes of signals, a top view (a layout diagram), and the like.

Figure 7A:
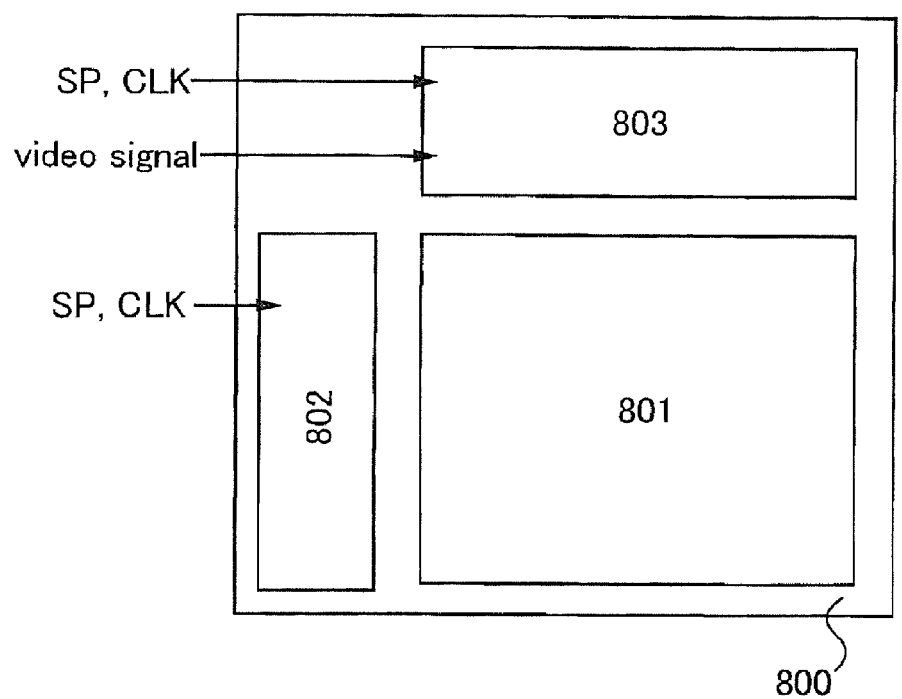
FIGS. 7A and 7B are a block diagram of a display device and a diagram for describing a TFT, respectively.
Figure 7B:
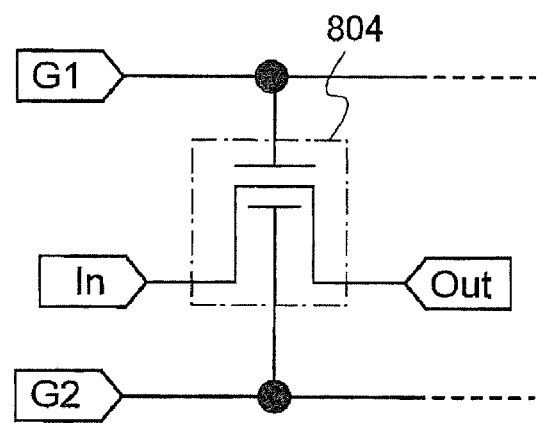

FIG. 7A illustrates an example of a block diagram of an active matrix liquid crystal display device. The liquid crystal display device illustrated in FIG. 7A includes, over a substrate 800, a pixel portion 801 including a plurality of pixels each provided with a display element, a scan line driver circuit 802 which controls scan lines connected to gate electrodes of the pixels, and a signal line driver circuit 803 which controls a video signal input to a selected pixel. Each pixel is provided with a thin film transistor 804 (TFT) illustrated in FIG. 7B. The thin film transistor 804 is an element controlling electric current between an In terminal and an Out terminal with a first control signal G1 and a second control signal G2. Note that a symbol of the thin film transistor 804 in FIG. 7B denotes a TFT controlled with four terminals described in any one of Embodiments 1 to 6 and is used in other drawings hereinafter.

Note that although a mode in which the scan line driver circuit 802 and the signal line driver circuit 803 are formed in the display device is described here, part of the scan line driver circuit 802 may be mounted over a semiconductor device such as an IC. Further, part of the signal line driver circuit 803 may be mounted over a semiconductor device such as an IC. Still further, a plurality of scan line driver circuits 802 may be provided over the substrate 800.

Figure 8:
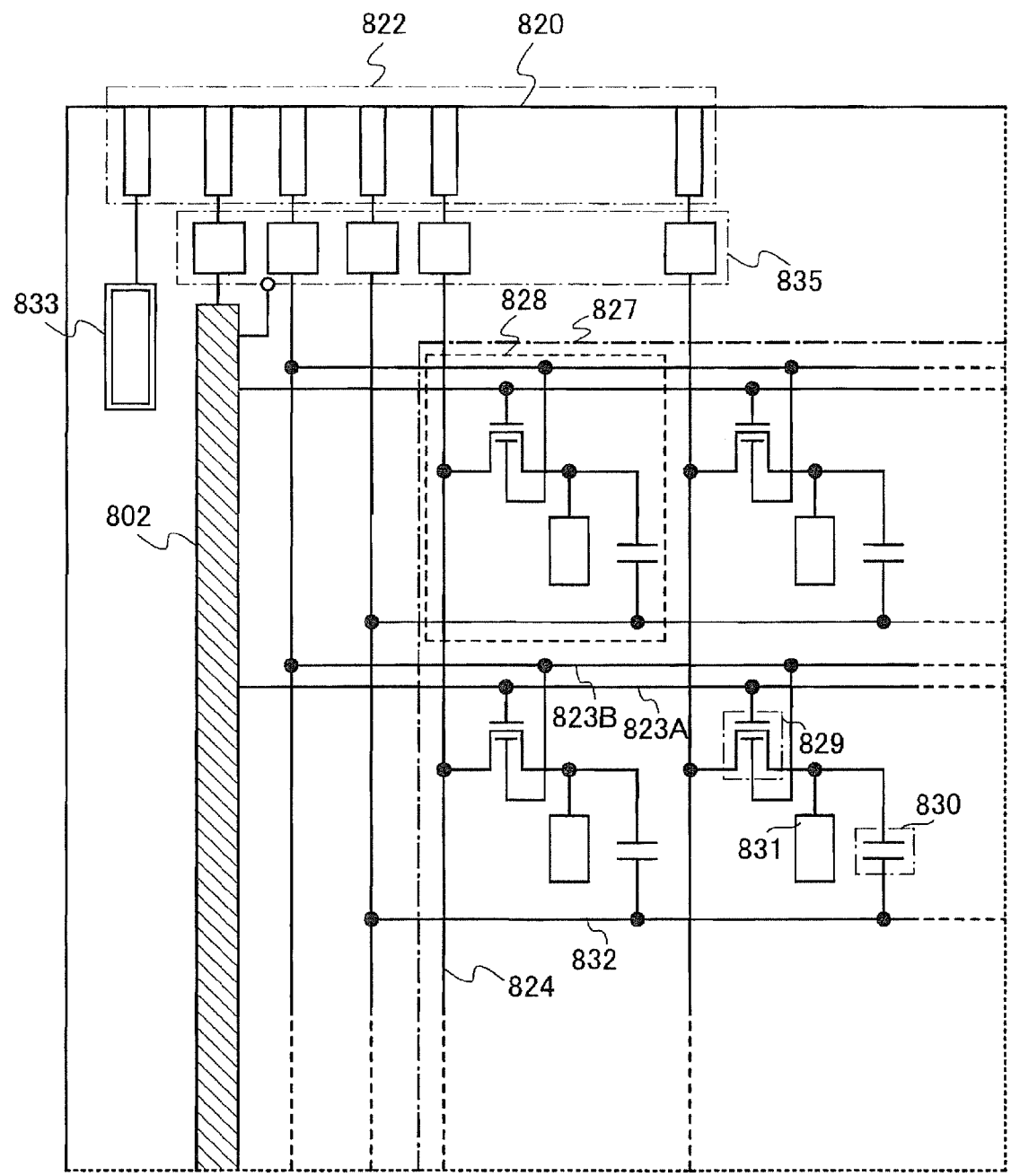
FIG. 8 is a block diagram of a display device.

FIG. 8 is a diagram illustrating a positional relation between a pixel portion and a protective circuit including a signal input terminal, a scan line, a signal line, and a non-linear element, which constitute the display device. Over a substrate 820 having an insulating surface, scan lines 823A and control lines 823B intersect with signal lines 824 in a pixel portion 827. The pixel portion 827 corresponds to the pixel portion 801 in FIG. 7A. Note that the control lines 823B may be arranged parallel to the signal line 824.

The pixel portion 827 includes a plurality of pixels 828 arranged in a matrix. The pixel 828 includes a pixel TFT (which may be referred to as a TFT) 829 connected to the scan line 823A, the control line 823B, and the signal line 824, a storage capacitor 830, and a pixel electrode 831.

The pixel structure here illustrates a case where one electrode of the storage capacitor 830 is connected to the pixel TFT 829 and the other electrode of the storage capacitor 830 is connected to a capacitor line 832. The pixel electrode 831 serves as one of electrodes which drive a display element (such as a liquid crystal element, a light-emitting element, or a contrast medium (electronic ink)). The other electrode (also referred to as a counter electrode) of the display element is connected to a common terminal 833. From the common terminal, a common potential is applied to the other electrode of the display element.

The protective circuit 835 is provided between a wiring extended from the pixel portion 827 and the signal line input terminal 822. The protective circuit 835 is also provided between the scan line driver circuit 802 and the pixel portion 827. In this embodiment, a plurality of protective circuits 835 are provided so that the pixel TFTs 829 and the like are not broken when surge voltage due to static electricity or the like is applied to the scan line 823A, the control line 823B, the signal line 824, or the capacitor line 832. That is, the protective circuits 835 are formed so that charge is released into a common wiring when surge voltage is applied.

In this embodiment, an example in which the protective circuits 835 are provided in the vicinity of the signal line input terminals 822 is shown. However, the position of the protective circuits 835 and the presence or absence of the protective circuits 835 is not limited to the example.

The use of the thin film transistor described in any one of Embodiments 1 to 6 as the pixel TFT 829 in FIG. 8 provides following advantages.

When a pixel including the thin film transistor manufactured by the method described in any one of Embodiments 1 to 6 is provided, control of the threshold voltage and/or increase in on current of the thin film transistor can be made without increase of the number of processes.

Figure 9:
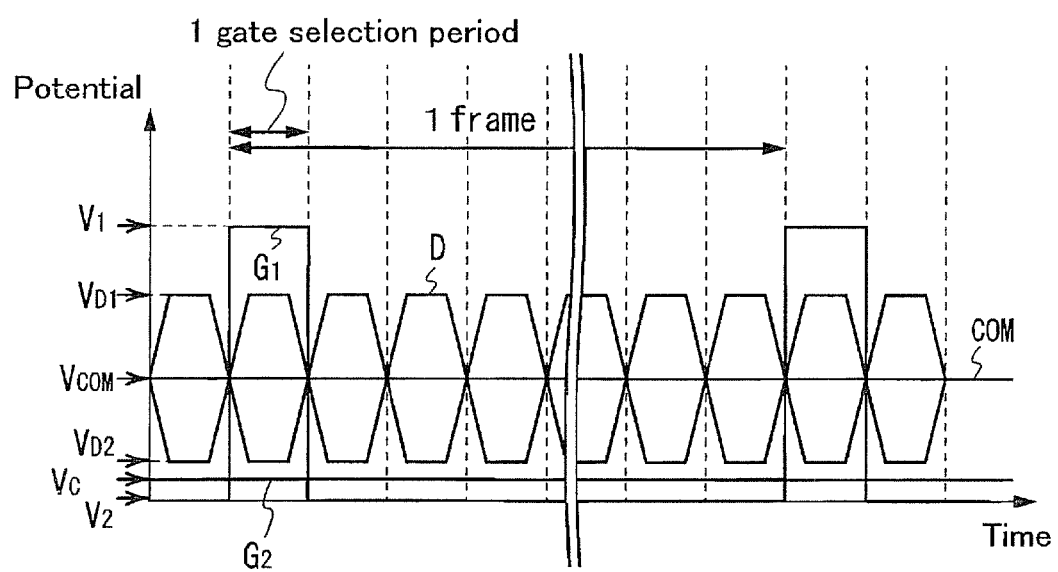
FIG. 9 is a waveform diagram showing potential changes.

FIG. 9 is a waveform diagram schematically showing potential changes of signals supplied to the pixel 828. Operation of the pixel 828 is described with reference to FIG. 9. FIG. 9 shows a waveform of potentials of each of the scan line 823A, the control line 823B, the signal line 824, and the capacitor line 832 which are connected to one pixel. In FIG. 9, a waveform G1 schematically represents a potential change of the scan line 823A, a waveform G2 schematically represents a potential change of the control line 823B, a waveform D schematically represents a potential change of the signal line 824, and a waveform COM schematically represents a potential change of the capacitor line 832. Changes in those waveforms over time are shown with the horizontal axis representing time and the vertical axis representing potential. Note that a high power supply potential of the waveform G1 is denoted as $V_1$ and a low power supply potential of the waveform G1 is denoted as $V_2$. A potential of the waveform G2 is denoted as $V_c$. A high power supply potential of the waveform D is denoted as $V_{D1}$ and a low power supply potential of the waveform D is denoted as $V_{D2}$. A potential of the waveform COM is denoted as $V_{COM}$. As shown in the diagram, a period of time from when the waveform G1 changes to $V_1$, until the waveform G1 changes to $V_1$ again after changing to $V_2$ corresponds to one frame period. Further, as shown in the diagram, a period of time from when the waveform G1 changes to $V_1$ until the waveform G1 changes to $V_2$ corresponds to one gate selection period.

In FIG. 9, in one gate selection period in one frame period, that is, in a period of time when the scan line 823A has $V_1$, the storage capacitor 830 in the pixel 828 holds a potential of the signal line 824 in the range of from $V_{D1}$ to $V_{D2}$. In FIG. 9, a period other than a gate selection period in one frame period, that is, in a period of time when the scan line 823A has $V_2$, the storage capacitor 830 in the pixel 828 holds a potential input during one gate selection period regardless of the potential of the signal line 824, which is in the range of from $V_{D1}$ to $V_{D2}$. Note that the waveform G2 schematically representing a potential change of the control line 823B is preferably kept at a fixed potential in such a range that the control line 823B does not cause malfunction of the pixel TFT 829 which is controlled on or off by the scan line 823A. By setting the potential $V_c$ of the control line 823B at $V_{D2}$ or lower, preferably in the range of from $V_2$ to $V_{D2}$, malfunction of the pixel TFT 829 which is controlled on or off by the scan line 823A can be prevented.

According to FIG. 9, in the case of the control line 823B is provided, by providing a pixel TFT manufactured by the method described in any one of Embodiments 1 to 6, control of the threshold voltage and/or increase in on current of the thin film transistor can be made without increase of the number of processes. Specifically, by setting a potential of the waveform G2 of the control line 823B at a fixed potential, a thin film transistor with a stable threshold voltage can be obtained, which is preferable.

Note that the waveform diagram in FIG. 9 schematically showing potential changes of signals supplied to the pixel 828 is a merely example and may be combined with another driving method. For example, a driving method such as an inversion drive may be employed, in which the polarity of a voltage applied to the pixel electrode is inverted every certain period or every frame or between pixels in accordance with the common potential of the common electrode. By the inversion drive, uneven display such as flickering of an image and deterioration of a display element such as a liquid crystal material can be suppressed. Note that as an example of the inversion drive, source line inversion drive, gate line inversion drive, dot inversion drive and the like can be given as well as frame inversion drive. Note that as a display method, a progressive method, an interlace method or the like can be employed. Further, one pixel may include a plurality of sub-pixels.

Figure 10A:
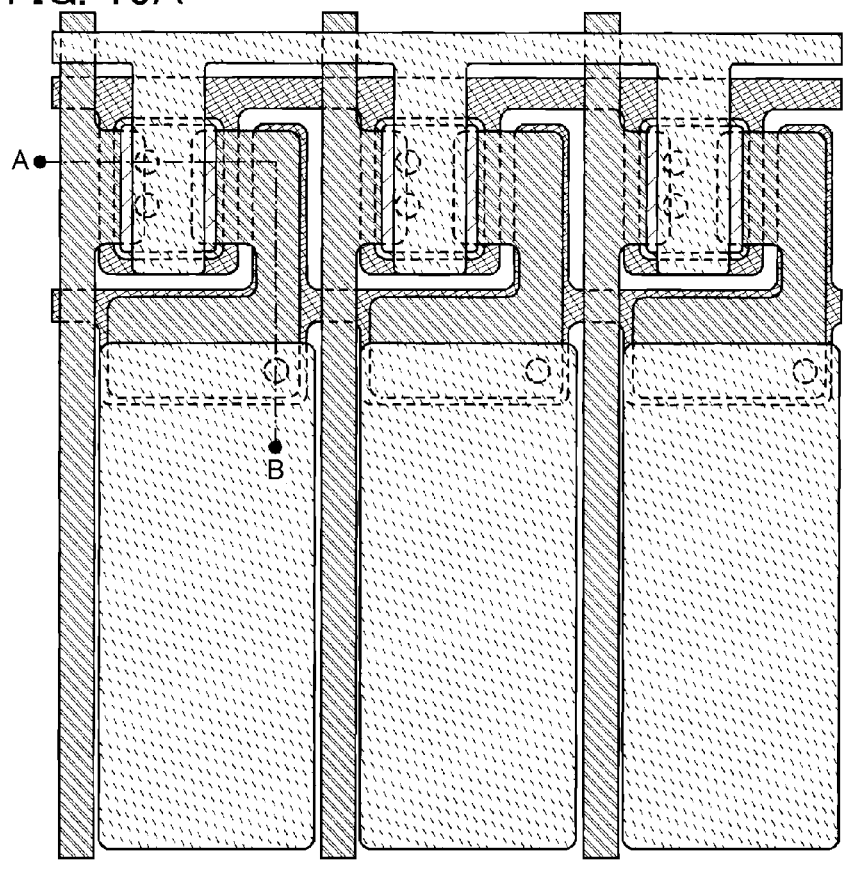
FIGS. 10A and 10B show layouts of pixels.
Figure 10B:
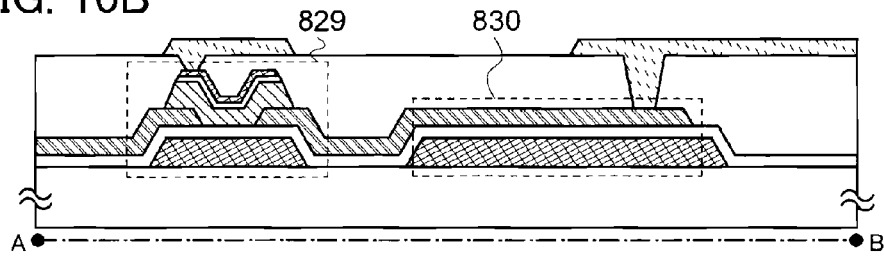

FIG. 10A is an example of a layout diagram of the pixel 828 in FIG. 8, and FIG. 10B is a cross-sectional view taken along dot line A-B of FIG. 10A. Note that the layout diagram of pixels of FIG. 10A shows an example of a so-called stripe arrangement in which pixels of three colors, RGB (R is red, G is green, and B is blue), are arranged along the scan line 823A. As for the arrangement of the pixels 828, delta or Bayer arrangement may alternatively be employed. Note that without limitation to the three colors of RGB, more than three colors may be used. For example, RGBW (W is white) or RGB with one or more colors of yellow, cyan, and magenta may be used. Note that areas of display regions in pixels may be different between color elements of RGB.

FIG. 10A illustrates a pixel circuit including a first conductive layer 1101 (a first gate electrode layer) which serves as a wiring serving as the scan line 823A and one electrode of the capacitor line 832, an oxide semiconductor film 1102 which forms a channel region of the pixel TFT 829, a second conductive layer 1103 which serves as a wiring serving as the signal line 824 and the other electrode of the capacitor line 832, a third conductive layer 1104 which serves as a second gate electrode layer, a fourth conductive layer 1105 (also referred to as a pixel electrode layer) which serves as a wiring serving as the control line 823B and the pixel electrode 831, and opening portions 1106 (referred to as contact hole) for connection between the second conductive layer 1103 and the pixel electrode 831 and connection between the fourth conductive layer and the control line 823B.

Note that, in the layout diagram of FIG. 10A, the facing portion of source and drain regions in the thin film transistor may have a U-like shape or a C-like shape. Further, the first conductive layer 1101 serving as a gate electrode layer may have a U-like shape or a C-like shape. In addition, the width in the channel length direction of the first conductive layer 1101 which serves as the first gate electrode is larger than the width of the oxide semiconductor film 1102. In addition, the width in a channel length direction of the third conductive layer 1104 which serves as the second gate electrode is smaller than the width of the first conductive layer 1101 and the width of the oxide semiconductor film 1102.

Figure 11:
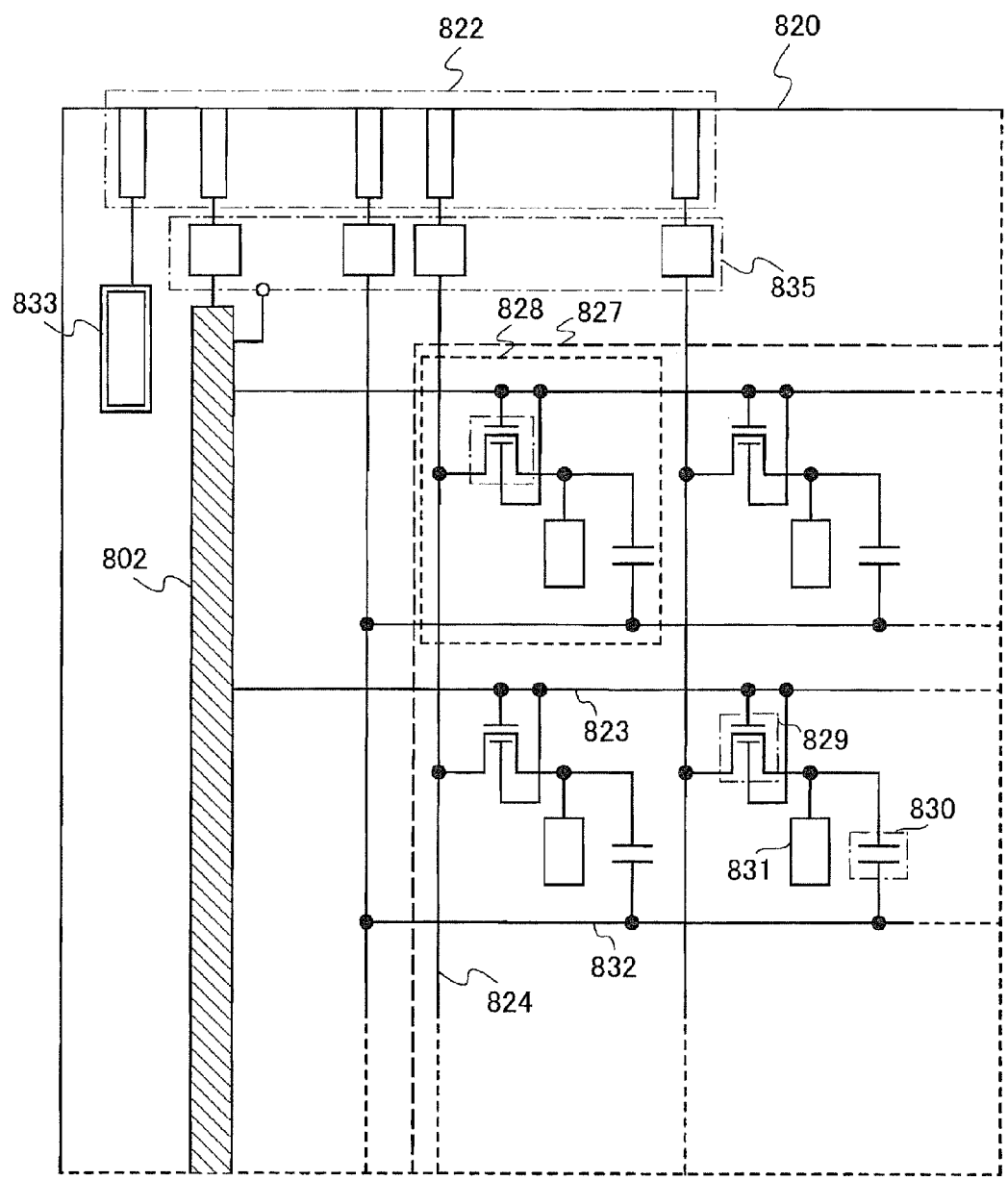
FIG. 11 is a block diagram of a display device.

FIG. 11 illustrates an example in which connection between the pixel TFTs and the scan lines is different from that in FIG. 8. In an example in FIG. 11, the first gate electrode 101 which is a scan line and the second gate electrode 133 which is a control line, which are provided to sandwich the oxide semiconductor layer in the thin film transistor described in any one of Embodiments 1 to 6, have the same potential. Note that the same portions in FIG. 11 as those in FIG. 8 are not repeatedly described.

FIG. 11 is a diagram illustrating a positional relation between a pixel portion and a protective circuit including a signal input terminal, a scan line, a signal line, and a non-linear element, which constitute the display device. FIG. 11 is different from FIG. 8 in that the control line 823B is not provided and a scan line 823 which corresponds to the scan line 823A in FIG. 8 is provided. As shown in FIG. 11, by controlling the pixel TFTs with the scan line 823, the control line can be omitted, which can decrease the number of wirings and signal line input terminals 822.

Figure 12:
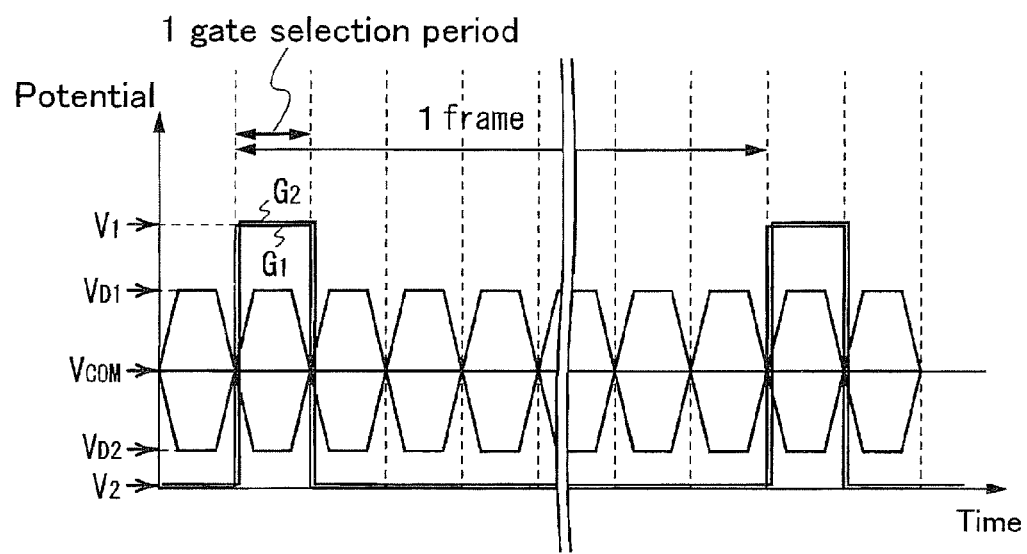
FIG. 12 is a waveform diagram showing potential changes.

FIG. 12 is a waveform diagram schematically showing a potential change of signals supplied to the pixel 828 in FIG. 11. Operation of the pixel 828 in FIG. 11 is described with reference to FIG. 12. FIG. 12 shows a waveform of potentials of each of the scan line 823, the signal line 824, and the capacitor line 832 which are connected to one pixel. Note that in FIG. 12, in order to clarify the difference from FIG. 9, a potential of the scan line 823 is shown separately as a potential of the first gate electrode and a potential of the second gate electrode, which are provided to sandwich the oxide semiconductor layer in the TFT. In FIG. 12, a waveform G1 schematically represents a potential change of the first gate electrode 101, a waveform G2 schematically represents a potential change of the second gate electrode 133, a waveform D schematically represents a potential change of the signal line 824, and a waveform COM schematically represents a potential change of the capacitor line 832. Changes in those waveforms over time are shown with the horizontal axis representing time and the vertical axis representing potential. Note that a high power supply potential of the waveform G1 and the waveform G2 is denoted as $V_1$ and a low power supply potential of the waveform G1 and the waveform G2 is denoted as $V_2$. A high power supply potential of the waveform D is denoted as $V_{D1}$ and a low power supply potential of the waveform D is denoted as $V_{D2}$. A potential of the waveform COM is denoted as $V_{COM}$. As shown in the diagram, a period of time from when the waveform G1 changes to $V_1$, until the waveform G1 changes to $V_1$ again after changing to $V_2$ corresponds to one frame period. Further, as shown in the diagram, a period of time from when the waveform G1 changes to $V_1$ until the waveform G1 changes to $V_2$ corresponds to one gate selection period.

In FIG. 12, in one gate selection period in one frame period, that is, in a period of time when the waveforms G1 and G2 have $V_1$, the storage capacitor 830 in the pixel 828 holds a potential of the signal line 824, which is in the range of from $V_{D1}$ to $V_{D2}$. In FIG. 12, a period other than a gate selection period in one frame period, that is, in a period of time when the waveforms G1 and G2 have $V_2$, the storage capacitor 830 in the pixel 828 holds a potential input during one gate selection period regardless of the potential of the signal line 824 in the range of from $V_{D1}$ to $V_{D2}$. Note that in FIG. 12, although the waveform G1 and the waveform G2 are in the same potential, they are separately shown for the sake of clarity.

By driving the pixel TFT 829 in a manner in which the waveform G1 and the waveform G2 are in the same potential as shown in FIG. 12, an area which becomes a channel in the pixel TFT 829 can be increased. Thus, an amount of current flowing through the pixel TFT 829 is increased, whereby high response speed of the display element can be realized.

Note that the waveform diagram in FIG. 12 schematically showing potential changes is one example as in the case of FIG. 9 and may be combined with another driving method. For example, a driving method such as an inversion drive may be employed, in which the polarity of a voltage applied to the pixel electrode is inverted every certain period or every frame or between pixels in accordance with the common potential of the common electrode. By the inversion drive, uneven display such as flickering of an image and deterioration of a display element such as a liquid crystal material can be suppressed. Note that as an example of the inversion drive, source line inversion drive, gate line inversion drive, dot inversion drive and the like can be given as well as frame inversion drive. Note that as a display method, a progressive method, an interlace method or the like can be employed. Further, one pixel may include a plurality of subpixels.

FIG. 13 is an example of a layout diagram of the pixel 828 in FIG. 11. Note that the layout diagram of pixels of FIG. 13 shows an example of a so-called stripe arrangement in which pixels of three colors, RGB (R is red, G is green, and B is blue), are arranged along the scan line 823. As for the arrangement of the pixels 828, delta or Bayer arrangement may alternatively be employed. Note that without limitation to the three colors of RGB, more than three colors may be used. For example, RGBW (W is white) or RGB with one or more colors of yellow, cyan, or magenta may be used. Note that areas of display regions in pixels may be different between color elements of RGB. A cross section along dot line A-B in FIG. 13 is the same as the cross section of FIG. 10B.

FIG. 13 illustrates a pixel circuit including the first conductive layer 1101 (the first gate electrode layer) which serves as a wiring serving as the scan line 823 and one electrode of the capacitor line 832, the oxide semiconductor film 1102 which forms a channel region of the pixel TFT 829, the second conductive layer 1103 which serves as a wiring serving as the signal line 824 and the other electrode of the capacitor line 832, the third conductive layer 1104 which serves as the second gate electrode layer, the fourth conductive layer 1105 which serves as a wiring connected to the first conductive layer 1101 and the pixel electrode 831, and the opening portions 1106 (referred to as contact holes) for connection between the second conductive layer 1103 and the pixel electrode 831 or between the first conductive layer 1101 and the fourth conductive layer 1105.

Note that, in the layout diagram of FIG. 13, the facing portion of source and drain regions in the thin film transistor may have a U-like shape or a C-like shape. Further, the first conductive layer 1101 serving as the first gate electrode layer may have a U-like shape or a C-like shape. In addition, in FIG. 13, the width in the channel length direction of the first conductive layer 1101 which serves as the first gate electrode layer is larger than the width of the oxide semiconductor film 1102. Further, the width in a channel length direction of the third conductive layer 1104 which serves as the second gate electrode is larger than the width of the first conductive layer 1101 and is smaller than the width of the oxide semiconductor film 1102.

As described above, when a pixel including the thin film transistor manufactured by the method described in any one of Embodiments 1 to 6 is provided, control of the threshold voltage and/or increase in on current of the thin film transistor can be made without increase of the number of processes.

Note that the contents described in each drawing in this embodiment can be freely combined with or replaced with the contents described in any of the other embodiments as appropriate.

Embodiment 8

In this embodiment, an example of a light-emitting display device will be described as a display device including the thin film transistor described in any one of Embodiments 1 to 6. As a display element included in a display device, a light-emitting element utilizing electroluminescence is described here. Light-emitting elements utilizing electroluminescence are classified according to whether a light-emitting material is an organic compound or an inorganic compound. The former is referred to as an organic EL element and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 14:
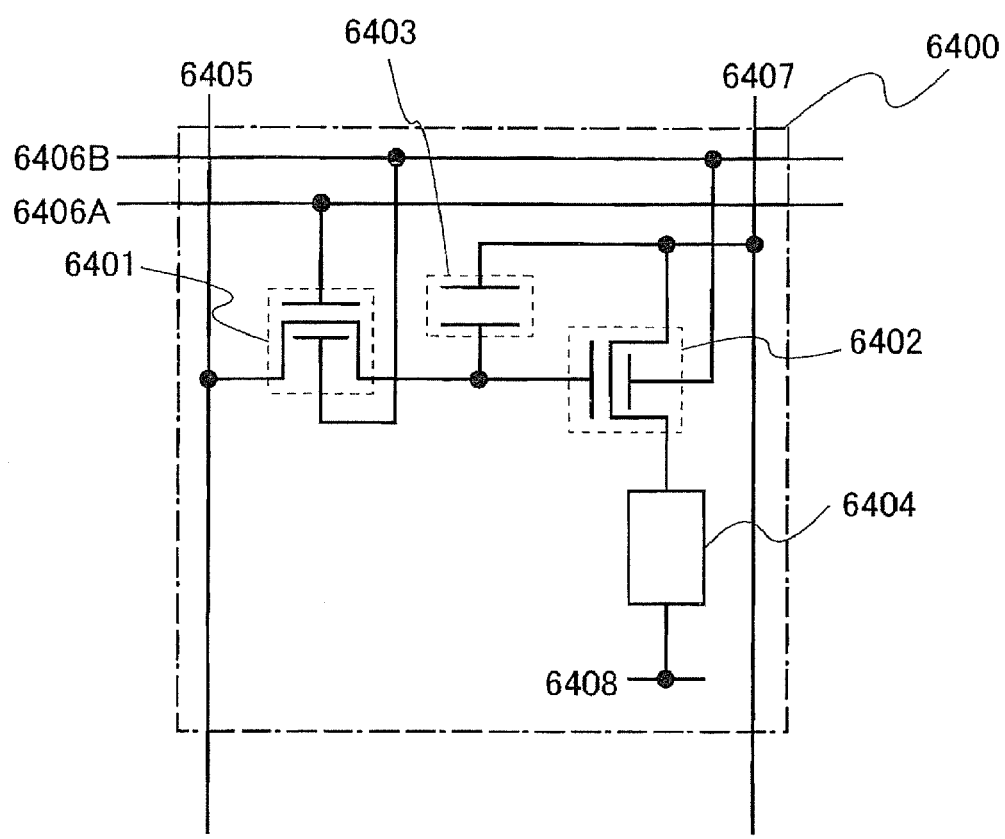
FIG. 14 is a diagram of an equivalent circuit of a pixel of a semiconductor device illustrating one embodiment of the present invention.

FIG. 14 shows an example of a pixel in a light-emitting display device including the thin film transistor described in any one of Embodiments 1 to 6.

A structure and an operation of the pixel in the light-emitting display device are described. In this example, one pixel includes two n-channel thin film transistors in each of which an oxide semiconductor film (typically, an In—Ga—Zn—O-based non-single-crystal film) is used in a channel formation region.

A pixel 6400 includes a switching transistor 6401 (also referred to as a first transistor), a driver transistor 6402 (also referred to as a second transistor), a light-emitting element 6404, and a capacitor 6403. The switching transistor 6401 has a first gate electrode connected to a scan line 6406A, a second gate electrode connected to a control line 6406B, a first electrode (one of a source electrode layer and a drain electrode layer) connected to a signal line 6405, and a second electrode (the other of the source electrode layer and the drain electrode layer) connected to a first gate electrode of the driver transistor 6402. The driver transistor 6402 has the first gate electrode connected to a power supply line 6407 through the capacitor 6403, a second gate electrode connected to the control line 6406B, a first electrode connected to the power supply line 6407, and a second electrode connected to a first electrode (a pixel electrode) of the light-emitting element 6404. A second electrode of the light-emitting element 6404 corresponds to a common electrode 6408. The common electrode 6408 is electrically connected to a common potential line provided over the same substrate, and the connection portion may be used as a common connection portion.

The second electrode (common electrode 6408) of the light-emitting element 6404 is set to a low power supply potential. Note that the low power supply potential is a potential satisfying that the low power supply potential is lower than a high power supply potential (low power supply potential<high power supply potential) based on the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of performing analog grayscale driving, voltage equal to or higher than the sum of the forward voltage of the light-emitting element 6404 and the threshold voltage of the driver transistor 6402 is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order to allow the driver transistor 6402 to operate in the saturation region, the potential of the power supply line 6407 is set higher than the gate potential of the driver transistor 6402. When an analog video signal is used, current can be made to flow through the light-emitting element 6404 in accordance with the video signal and analog grayscale driving can be performed.

As shown in FIG. 14, by providing the control line 6406B, the threshold voltages of the switching transistor 6401 and the driver transistor 6402 can be controlled as in the thin film transistor described in any one of Embodiments 1 to 6. Specifically, in the driver transistor 6402, a video signal is input so that the driver transistor 6402 operates in the saturation region. Therefore, by controlling the threshold voltage by a potential of the control line 6406B, a deviation between an input video signal and luminance of the light-emitting element due to threshold voltage shift can be reduced. As a result, display quality of the display device can be improved.

Note that the switching transistor 6401 serves as a switch, and a potential of the second gate is not always required to be controlled by the control line 6406B.

Note that the pixel structure is not limited to that illustrated in FIG. 14. For example, a switch, a resistor, a capacitor, a transistor, a logic circuit, or the like may be added to the pixel illustrated in FIG. 14.

In the case of digital grayscale driving instead of analog grayscale driving, a video signal is input to the gate of the driver transistor 6402 so that the driver transistor 6402 is either completely turned on or completely turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to the sum voltage of the power supply line voltage and $V_{th}$ of the driver transistor 6402 (voltage of the power supply line+$V_{th}$ of the driver transistor 6402) is applied to the signal line 6405. In this case, the same structure as in FIG. 14 can be employed.

Next, structures of the light-emitting element will be described with reference to FIGS. 15A to 15C. Here, a cross-sectional structure of a pixel will be described by taking an n-channel driving TFT as an example. Thin film transistors 7001, 7011, and 7021 serving as driver TFTs used for semiconductor devices illustrated in FIGS. 15A to 15C can be formed by a method similar to the method for forming the thin film transistor 141 described in Embodiment 1. The thin film transistors 7001, 7011, and 7021 each include an oxide semiconductor film for a channel formation region.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a top emission structure will be described with reference to FIG. 15A.

Figure 15A:
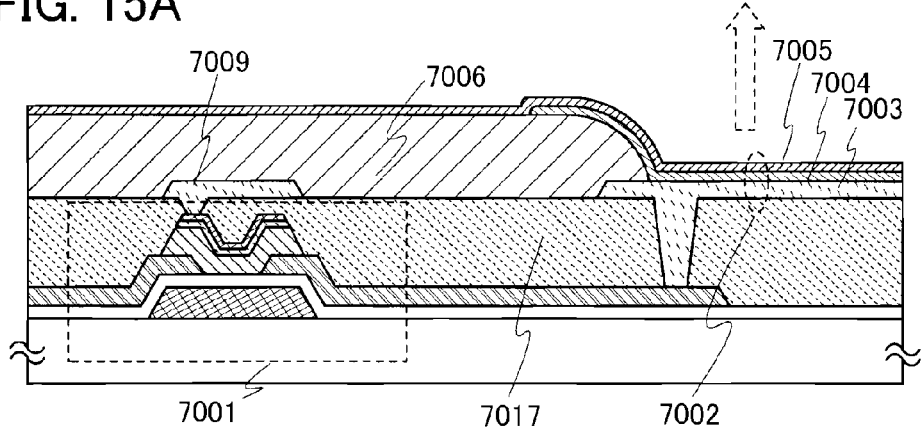
FIGS. 15A to 15C are each a cross-sectional view of a semiconductor device illustrating one embodiment of the present invention.

FIG. 15A is a cross-sectional view of a pixel in which the thin film transistor 7001 formed by a manufacturing method of a thin film transistor described in Embodiment 1 is provided as a driver TFT and light emitted from a light-emitting element 7002 electrically connected to the thin film transistor 7001 goes out through an anode 7005. The thin film transistor 7001 is covered with an interlayer insulating layer 7017, and a lead wiring 7009 is provided over the interlayer insulating layer 7017. In the thin film transistor 7001, an In—Ga—Zn—O-based oxide semiconductor is used for an oxide semiconductor film. In FIG. 15A, a cathode 7003 of the light-emitting element 7002 and the driving thin film transistor 7001 are electrically connected to each other, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used.

Further, in FIG. 15A, the lead wiring 7009 formed from the same material as the cathode 7003 overlaps with the oxide semiconductor film to shield the oxide semiconductor film from light. The threshold value of the thin film transistor 7001 can be controlled by the potential of a second gate electrode connected to the lead wiring 7009. By forming the cathode 7003 and the lead wiring 7009 from the same material, the number of steps can be reduced.

In addition, a partition 7006 formed from an insulating material is provided in order to prevent short circuit of the lead wiring 7009 and the cathode 7003. The light-emitting layer 7004 is provided so as to overlap with both a part of the partition 7006 and an exposed part of the cathode 7003.

The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 15A, light is emitted from the light-emitting element 7002 to the anode 7005 side as indicated by an arrow.

Next, a light-emitting element having a bottom emission structure will be described with reference to FIG. 15B. FIG. 15B is a cross-sectional view of a pixel in which a thin film transistor 7011 is formed, as a driver TFT, by a manufacturing method of a thin film transistor described in Embodiment 1 and light emitted from a light-emitting element 7012 electrically connected to the driver TFT 7011 goes out through a cathode 7013. The thin film transistor 7011 is covered with an interlayer insulating layer 7017, and a lead wiring 7019 is provided over the interlayer insulating layer 7017. In the thin film transistor 7011, an In—Ga—Zn—O-based oxide semiconductor is used as an oxide semiconductor film. In FIG. 15B, the cathode 7013 of the light-emitting element 7012 is formed over a light-transmitting conductive film 7010 that is electrically connected to the thin film transistor 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 15A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. As in the case of FIG. 15A, the light-emitting layer 7014 may be formed using either a single layer or a plurality of layers stacked. The anode 7015 is not required to transmit light, but can be formed using a light-transmitting conductive material as in the case of FIG. 15A. As the light-blocking film 7016, a metal or the like that reflects light can be used for example; however, it is not limited to a metal film. For example, a resin or the like to which black pigments are added can also be used.

Figure 15B:
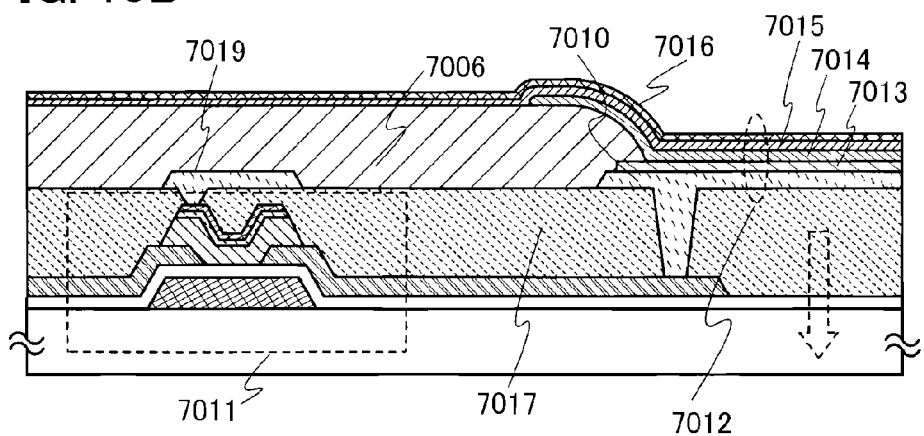

In FIG. 15B, the lead wiring 7019 formed from the same light-transmitting conductive material as the conductive film 7010 having a light-transmitting property overlaps with the oxide semiconductor film. In this embodiment, indium tin oxide including $SiO_x$ is used as a material for the lead wiring 7019. The threshold value of the thin film transistor 7011 is controlled by a second gate electrode connected to the lead wiring 7019. By forming the conductive film 7010 having a light-transmitting property and the lead wiring 7019 from the same material, the number of steps can be reduced. The oxide semiconductor film of the thin film transistor 7011 is shielded from light by the second gate electrode formed below the lead wiring 7019.

The light-emitting element 7012 corresponds to a region where the light-emitting layer 7014 is sandwiched between the cathode 7013 and the anode 7015. In the case of the pixel illustrated in FIG. 15B, light is emitted from the light-emitting element 7012 to the cathode 7013 side as indicated by an arrow.

Next, a light-emitting element having a dual emission structure will be described with reference to FIG. 15C. FIG. 15C is a cross-sectional view of a pixel in which a thin film transistor 7021 is formed, as a driver TFT, by a manufacturing method of a thin film transistor described in Embodiment 1 and light emitted from a light-emitting element 7022 electrically connected to the thin film transistor 7021 goes out through both of an anode 7025 and an cathode 7023. The thin film transistor 7021 is covered with the interlayer insulating layer 7017, and a lead wiring 7029 is provided over the interlayer insulating layer 7017. In the thin film transistor 7021, an In—Ga—Zn—O-based oxide semiconductor is used for an oxide semiconductor film.

In addition, the cathode 7023 of the light-emitting element 7022 is formed over a light-transmitting conductive film 7028 which is electrically connected to the thin film transistor 7021. Over the cathode 7023, a light-transmitting 7024 and an anode 7025 are provided in this order. As in the case of FIG. 15A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 15A, the light-emitting layer 7024 may be formed using either a single layer or a plurality of layers stacked. The anode 7025 can be formed using a light-transmitting conductive material as in the case of FIG. 15A.

The light-emitting element 7022 corresponds to a region where the cathode 7023, the light-emitting layer 7024, and the anode 7025 overlap with one another. In the case of the pixel illustrated in FIG. 15C, light is emitted from the light-emitting element 7022 to both the anode 7025 side and the cathode 7023 side as indicated by arrows.

Figure 15C:
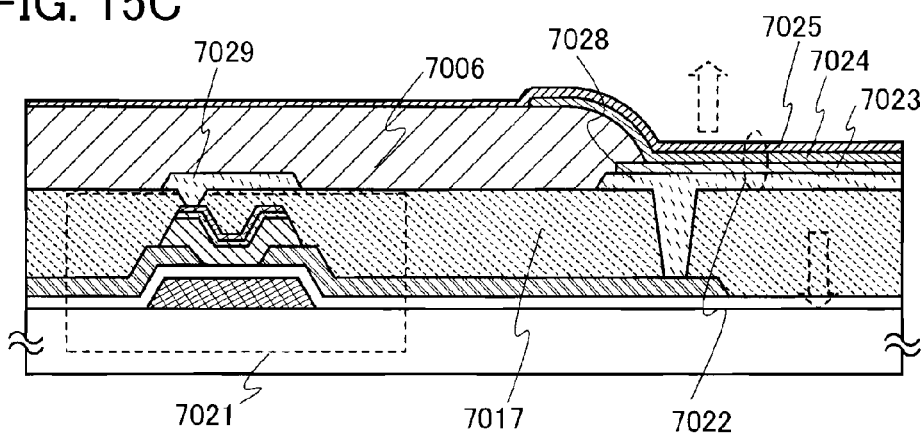

Further in FIG. 15C, the lead wiring 7029 overlaps with the oxide semiconductor film. As a material of the lead wiring 7029, a light-transmitting conductive material, titanium, titanium nitride, aluminum, tungsten, or the like is preferable. In this embodiment, a Ti film is used for the material of the lead wiring 7029. The threshold value of the thin film transistor 7021 is controlled by a second gate electrode connected to the lead wiring 7029. The oxide semiconductor film of the thin film transistor 7021 is shielded from light by the lead wiring 7029. The light-transmitting conductive film 7028 electrically connected to the thin film transistor 7021 is formed of a Ti film same as the lead wiring 7029.

Note that, although the organic EL elements are described here as the light-emitting elements, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 16A:
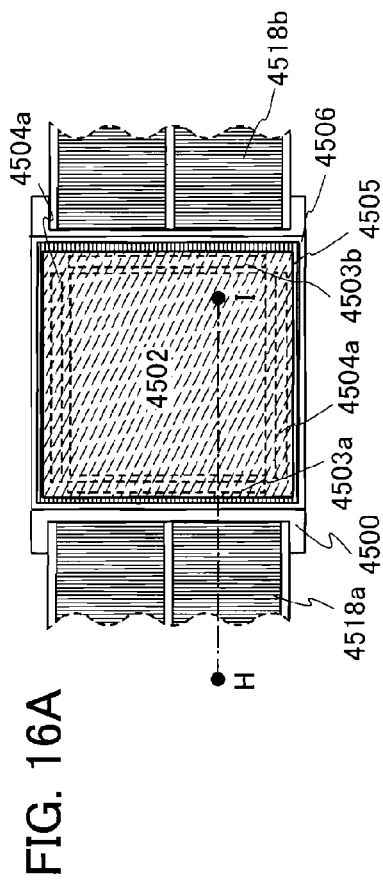
FIGS. 16A and 16B are a top view and a cross-sectional view, respectively, of a semiconductor device illustrating one embodiment of the present invention.
Figure 16B:
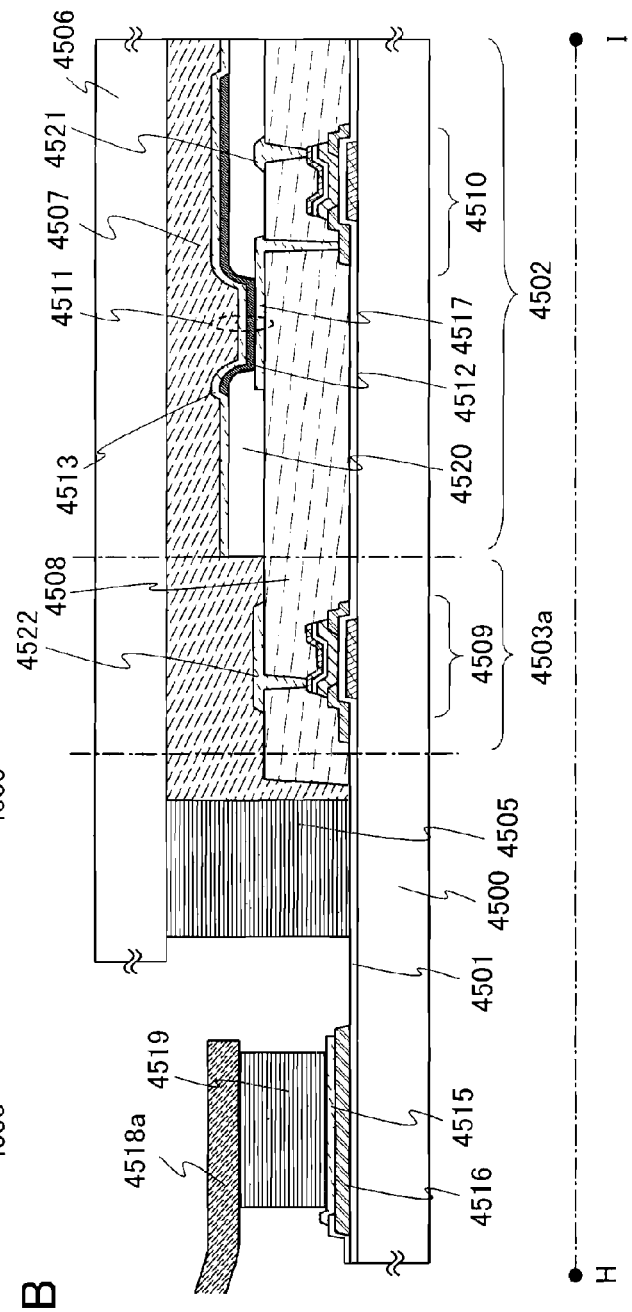

Next, the appearance and cross section of a light-emitting display panel (also referred to as a light-emitting panel) which corresponds to an embodiment of a semiconductor device according to the present invention will be described with reference to FIGS. 16A and 16B. FIG. 16A is a top view of a panel in which thin film transistors and a light-emitting element formed over a first substrate are sealed between the first substrate and a second substrate with a sealant. FIG. 16B is a cross-sectional view taken along line H-I of FIG. 16A.

A sealant 4505 is provided so as to surround a pixel portion 4502, signal line driver circuits 4503a and 4503b, and scan line driver circuits 4504a and 4504b, which are provided over a first substrate 4500. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4500, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b which are formed over the first substrate 4500 each include a plurality of thin film transistors. A thin film transistor 4510 included in the pixel portion 4502 and a thin film transistor 4509 included in the signal line driver circuit 4503a are illustrated as an example in FIG. 16B.

The thin film transistors 4509 and 4510 include an In—Ga—Zn—O-based oxide semiconductor as an example. In this embodiment, the thin film transistors 4509 and 4510 are n-channel thin film transistors. The thin film transistors 4509 and 4510 are covered with an interlayer insulating layer 4508 in contact with an oxide semiconductor film. Note that a top face and side faces of the interlayer insulating layer 4508 may be covered with a protective insulating layer formed of a nitride silicon film. A conductive layer 4522 serving as a lead wiring is provided over the thin film transistor 4509. In addition, a conductive layer 4521 serving as a lead wiring is provided over the thin film transistor 4510. The conductive layers 4521 and 4522 are, as lead wirings, connected to second gate electrodes of the thin film transistors and control threshold values of the thin film transistors.

In the case where a light-blocking conductive film is used as the conductive layer 4522, the oxide semiconductor film of the thin film transistor 4509 can be shielded from light. In the case where the conductive layer 4522 serving as the lead wiring connected to the second gate electrode is formed using a light-blocking material, varying electric characteristics of the thin film transistor due to photosensitivity of the oxide semiconductor can be prevented and thus the electric characteristics can be stabilized.

The width of the conductive layer 4521 may be different from the width of the conductive layer 4522. The width of the conductive layer 4521 is smaller than the width of the gate electrode of the thin film transistor 4510. By making the width of the conductive layer 4521 smaller than that of the gate electrode of the thin film transistor 4510, an area in which the conductive layer 4521 overlaps with the wiring layer is reduced, whereby a parasitic capacitance can be reduced. As illustrated in FIG. 16B, the width of the conductive layer 4521 and the width of the conductive layer 4522 are different as selective from each other, whereby in addition to blocking light by second gate electrode, the light-blocking effect with respect to the thin film transistor can be improved.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, an electroluminescent layer 4512, and a second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518*a* via an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or the scan line driver circuits or part thereof may be separately formed and mounted. This embodiment is not limited to the structure illustrated in FIGS. 16A and 16B.

Through the above process, a highly reliable light-emitting display device (display panel) as a semiconductor device can be manufactured.

This embodiment can be implemented in appropriate combination with the structures described in the other embodiments.

Embodiment 9

Thin film transistors each including an oxide semiconductor film which are described in any one of Embodiments 1 to 6 are be manufactured and a liquid crystal display device having a display function can be manufactured using the thin film transistors not only in a driver circuit but also in a pixel portion. Further, part or whole of a driver circuit can be formed over the same substrate as a pixel portion, using a thin film transistor, whereby a system-on-panel can be obtained.

The liquid crystal display device includes a liquid crystal element (also referred to as a liquid crystal display element) as a display element.

Further, a liquid crystal display device includes a panel in which a liquid crystal display element is sealed, and a module in which an IC or the like including a controller is mounted to the panel. An embodiment of the present invention also relates to an element substrate, which corresponds to one mode before the display element is completed in a manufacturing process of the liquid crystal display device, and the element substrate is provided with means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a liquid crystal display device in this specification means an image display device, a display device, or a light source (including a lighting device). Further, the liquid crystal display device includes any of the following modules in its category: a module to which a connector such as an FPC (flexible printed circuit), a TAB (tape automated bonding) tape, or a TCP (tape carrier package) is attached; a module having a TAB tape or a TCP which is provided with a printed wiring board at the end thereof; and a module having an IC (integrated circuit) directly mounted on a substrate provided with a display element by a COG (chip on glass) method.

The appearance and a cross section of a liquid crystal display panel, which is one embodiment of a liquid crystal display device, will be described with reference to FIGS. 17A1, 17A2, and 17B. FIGS. 17A1 and 17A2 are top views of panels in which a liquid crystal element 4013 is sealed with a sealant 4005 between a first substrate 4001 and a second substrate 4006. FIG. 17B is a cross-sectional view taken along M-N of FIGS. 17A1 and 17A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. The liquid crystal layer 4008 in this embodiment includes, but is particularly not limited to, a blue-phase liquid crystal material is used for. A liquid crystal material exhibiting a blue phase has a short response time of 1 millisecond or less from the state of applying no voltage to the state of applying voltage, whereby short-time response is possible. The liquid crystal material exhibiting a blue phase includes a liquid crystal and a chiral agent. The chiral agent is employed to align the liquid crystal in a helical structure and to make the liquid crystal exhibit a blue phase. For example, a liquid crystal material into which a chiral agent is mixed at 5 wt % or more may be used for the liquid crystal layer. As a liquid crystal, a thermotropic liquid crystal, a low molecular liquid crystal, a high molecular liquid crystal, a ferroelectric liquid crystal, an anti-ferroelectric liquid crystal, or the like is used.

In FIG. 17A1, a signal line driver circuit 4003 that is formed using a single crystal semiconductor film or a polycrystalline semiconductor film over a substrate separately prepared is mounted in a region that is different from the region surrounded by the sealant 4005 over the first substrate

4001. In contrast, FIG. 17A2 illustrates an example in which part of a signal line driver circuit is formed over the first substrate 4001. A signal line driver circuit 4003b is formed over the first substrate 4001 and a signal line driver circuit 4003a which is formed using a single crystal semiconductor film or a polycrystalline semiconductor film is mounted on the substrate separately prepared.

Note that the connection method of a driver circuit which is separately formed is not particularly limited, and a COG method, a wire bonding method, a TAB method, or the like can be used. FIG. 17A1 illustrates an example in which the signal line driver circuit 4003 is mounted by a COG method, and FIG. 17A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 17B illustrates the thin film transistor 4010 included in the pixel portion 4002 and the thin film transistor 4011 included in the scan line driver circuit 4004, which are over an insulating film 4007 serving as a base film. An interlayer insulating layer 4021 is provided over the thin film transistors 4010 and 4011. As the thin film transistors 4010 and 4011, the thin film transistor which is described in any one of Embodiments 1 to 6 can be employed. In this embodiment, the thin film transistors 4010 and 4011 are n-channel thin film transistors each include an oxide semiconductor film for a channel formation region.

The thin film transistors 4010 and 4011 are covered with the interlayer insulating layer 4021. The interlayer insulating layer 4021 is provided over and in contact with the oxide semiconductor films of the thin film transistors 4010 and 4011 and a first gate insulating film 4020.

The interlayer insulating layer 4021 which can be used as a planarizing insulating film can be formed from an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The interlayer insulating layer may be formed by stacking a plurality of insulating films formed of these materials. The interlayer insulating layer 4021 is a light-transmitting resin layer and a photosensitive polyimide resin is used in this embodiment.

There is no particular limitation on the formation method of the insulating layer having a stacked structure, and the following method can be employed in accordance with the material: sputtering, an SOG method, spin coating, dip coating, spray coating, droplet discharging (e.g., ink jetting, screen printing, or offset printing), doctor knife, roll coating, curtain coating, knife coating, or the like.

Further, a lead wiring 4028 connected to a second gate electrode is formed over the interlayer insulating layer 4021 and in a position overlapping with the oxide semiconductor film of the thin film transistor 4011. A lead wiring 4029 connected to a second gate electrode is formed over the interlayer insulating layer 4021 and in a position overlapping with the oxide semiconductor film of the thin film transistor 4010.

A pixel electrode layer 4030 and a common electrode layer 4031 are provided over the first substrate 4001, and the pixel electrode layer 4030 is electrically connected to the thin film transistor 4010. The lead wirings 4028 and 4029 can have the same potential as the common electrode layer 4031. The lead wirings 4028 and 4029 can be formed in the same step as the common electrode layer 4031. Further, if the lead wirings 4028 and 4029 are formed using a light-blocking conductive film, they can also serve as light-blocking layers shielding the oxide semiconductor films of the thin film transistors 4011 and 4010 from light.

Alternatively, the lead wirings 4028 and 4029 can have a different potential from the common electrode layer 4031. In this case, a control line electrically connected to the lead wirings 4028 and 4029 is provided and the threshold voltage of the thin film transistors 4011 and 4010 are controlled with a potential of the control line.

The liquid crystal element 4013 includes the pixel electrode layer 4030, the common electrode layer 4031, and the liquid crystal layer 4008. In this embodiment, a method is used in which grayscale is controlled by generating an electric field which is substantially parallel to a substrate (i.e., in a lateral direction) to move liquid crystal molecules in a plane parallel to the substrate. In such a method, an electrode structure used in an in plane switching (IPS) mode or a fringe field switching (FFS) mode can be used. Note that a polarizing plate 4032 and a polarizing plate 4033 are provided on the outer sides of the first substrate 4001 and the second substrate 4006, respectively.

As the first substrate 4001 and the second substrate 4006, glass, plastic, or the like having a light-transmitting property can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer denoted by reference numeral 4035 is obtained by selective etching of an insulating film and is provided in order to control the thickness (a cell gap) of the liquid crystal layer 4008. Alternatively, a spherical spacer may also be used. The columnar spacer 4035 is located to overlap with the lead wiring 4029.

FIGS. 17A1 and 17A2 and 17B illustrate examples of liquid crystal display devices in which a polarizing plate is provided on the outer side (the view side) of a substrate; however, the polarizing plate may be provided on the inner side of the substrate. The position of the polarizing plate may be determined as appropriate depending on the material of the polarizing plate and conditions of the manufacturing process. Furthermore, a light-blocking layer serving as a black matrix may be provided.

In FIGS. 17A1, 17A2, and 17B, a light-blocking layer 4034 is provided on the second substrate 4006 side so as to cover the thin film transistors 4010 and 4011. By the light-blocking layer 4034, further improvement in contrast and in stabilization of the thin film transistors can be achieved.

When the light-blocking layer 4034 is provided, the intensity of incident light on the oxide semiconductor films of the thin film transistors can be attenuated. Accordingly, electric characteristics of the thin film transistors can be stabilized and prevented from being varied due to photosensitivity of the oxide semiconductor.

The pixel electrode layer 4030, the common electrode layer 4031, the lead wirings 4028 and 4029 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can also be used for the pixel electrode layer 4030, the common electrode layer 4031, and the lead wirings 4028 and 4029.

Further, a variety of signals and potentials are supplied to the signal line driver circuit 4003 which is formed separately, the scan line driver circuit 4004, or the pixel portion 4002 from an FPC 4018.

Since a thin film transistor is easily broken due to static electricity or the like, a protective circuit for protecting the driver circuit is preferably provided over the same substrate for a gate line or a source line. The protective circuit is preferably formed with a non-linear element including an oxide semiconductor.

In FIGS. 17A1, 17A2, and 17B, a connection terminal electrode 4015 is formed using the same conductive film as that of the pixel electrode layer 4030, and a terminal electrode 4016 is formed using the same conductive film as that of source and drain electrode layers of the thin film transistors 4010 and 4011.

The connection terminal electrode 4015 is electrically connected to a terminal included in the FPC 4018 via an anisotropic conductive film 4019.

Although FIGS. 17A1 and 17A2, and 17B show an example in which the signal line driver circuit 4003 is formed separately and mounted on the first substrate 4001, this embodiment is not limited to this structure. The scan line driver circuit may be separately formed and then mounted, or only part of the signal line driver circuit or part of the scan line driver circuit may be separately formed and then mounted.

Figure 18:
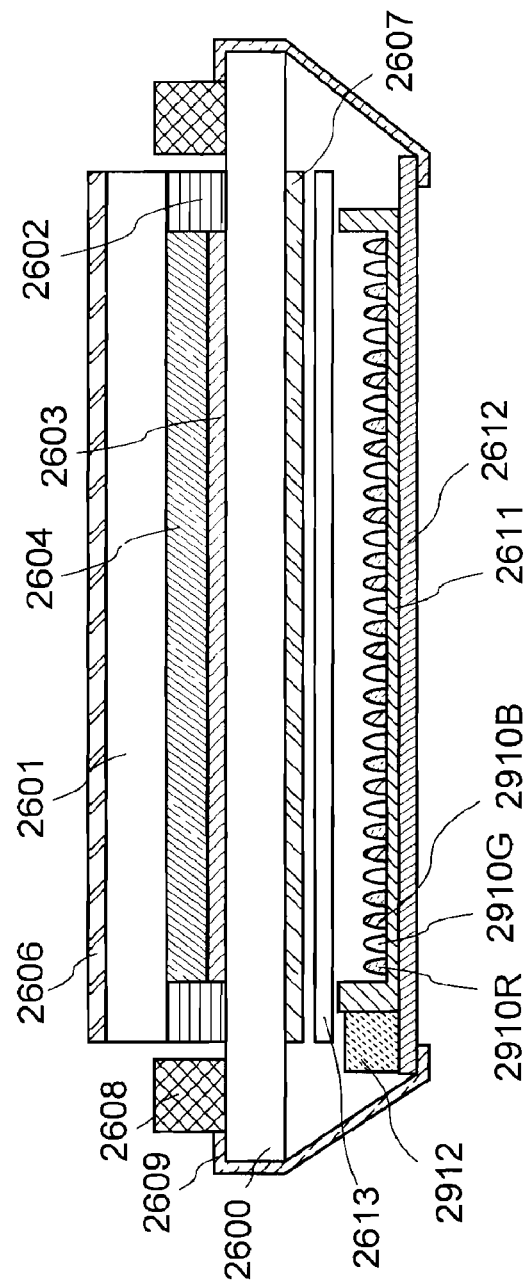
FIG. 18 is a cross-sectional view illustrating a semiconductor device of one embodiment of the present invention.

FIG. 18 illustrates an example of a cross-sectional structure of a liquid crystal display device in which an element substrate 2600 and a counter substrate 2601 are attached to each other with a sealant 2602, and an element layer 2603 including a thin film transistor or the like and a liquid crystal layer 2604 are provided between the substrates.

In the case where color display is performed, light-emitting diodes which emit light of plural colors are arranged in a backlight portion. In the case of an RGB mode, a red light-emitting diode 2910R, a green light-emitting diode 2910G, and a blue light-emitting diode 2910B are disposed in each of the regions into which a display area of the liquid crystal display device is divided.

A polarizing plate 2606 is provided on the outer side of the counter substrate 2601, and a polarizing plate 2607 and an optical sheet 2613 are provided on the outer side of the element substrate 2600. A light source is formed using the red light-emitting diode 2910R, the green light-emitting diode 2910G, the blue light-emitting diode 2910B, and a reflective plate 2611. An LED control circuit 2912 provided for a circuit board 2612 is connected to a wiring circuit portion 2608 of the element substrate 2600 through a flexible wiring board 2609 and further includes an external circuit such as a control circuit or a power source circuit.

This embodiment describes a field-sequential liquid crystal display device in which the LEDs are individually made to emit light by this LED control circuit 2912, but this embodiment is not particularly limited thereto. It is also possible to use a cold cathode fluorescent lamp or a white LED as a light source of the backlight and to provide a color filter.

Further, in this embodiment, an example of an electrode structure used in the IPS mode is described; however, there is no particularly limitation on an electrode structure mode. The following mode can be used: a TN (twisted nematic) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like.

This embodiment can be implemented in appropriate combination with the structures described in the other embodiments.

Embodiment 10

In this embodiment, an example of an electronic paper will be described as a semiconductor device which includes a plurality of thin film transistors including an oxide semiconductor film.

Figure 19A:
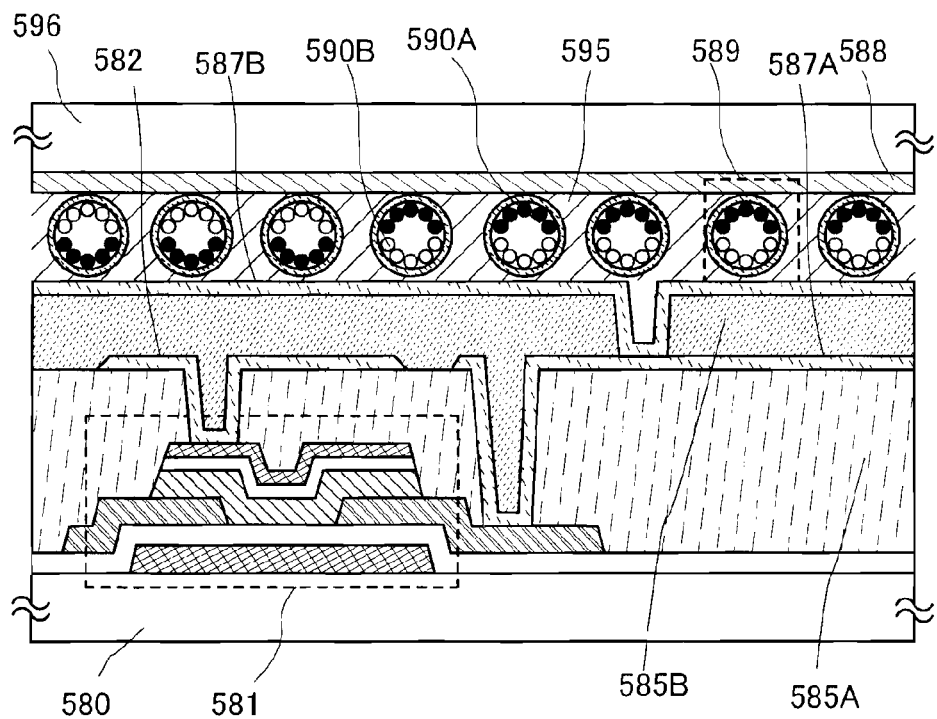
FIGS. 19A and 19B are a cross-sectional view and an external view, respectively, of an electronic appliance illustrating a semiconductor device of one embodiment of the present invention.

FIG. 19A is a cross-sectional view illustrating an active matrix electronic paper. As a thin film transistor 581 used in a display portion of the semiconductor device, the thin film transistor which is described in any one of Embodiments 1 to 6 can be employed.

FIG. 19A illustrates an example of an electrophoretic display device using electrophoretic materials (an electrophoretic display element of a microcapsule system) in which a microcapsule is filled with positively or negatively-charged white and black fine particles. An electrophoretic display element of a microcapsule system is an element which performs display with use of transparent liquid, a white fine particle which is positively-charged, and a black fine particle which is negatively-charged in a microcapsule having a diameter of approximately 10 μm to 200 μm. When electric field is applied by electrodes sandwiching the microcapsule, the white fine particle and the black fine particle move to opposite directions. The white fine particle has higher reflectance than the black fine particle, and reflection amount of external light is adjusted, whereby white or black color can be displayed. Note that a display device provided with an electrophoretic element to which this principle is applied is called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

A thin film transistor 581 formed over a substrate 580 is manufactured by the process described in any one of Embodiments 1 to 6. A first electrode layer 587A is electrically connected to a source or drain electrode layer through an opening formed in an interlayer insulating layer 585A. A lead wiring 582 connected to a second electrode is formed over the interlayer insulating layer 585A covering the thin film transistor 581. An interlayer insulating layer 585B is formed to cover the lead wiring 582 and the first electrode layer 587A. A second electrode layer 587B is electrically connected to the first electrode layer 587A through an opening formed in the interlayer insulating layer 585B.

Spherical particles 589 each having a black fine particle 590A and a white fine particle 590B are provided between the second electrode layer 587B and a third electrode layer 588. The circumference of the spherical particle 589 is filled with filler 595 such as a resin or the like (see FIG. 19A). In this embodiment, the second electrode layer 587B corresponds to a pixel electrode and the third electrode layer 588 provided for a substrate 596 corresponds to a common electrode. The third electrode layer 588 is electrically connected to a common potential line provided over the same substrate as the thin film transistor 581 is. With the use of a common connection portion, the third electrode layer 588 can be electrically connected to the common potential line through conductive particles provided between a pair of substrates.

Further, instead of an electrophoretic display element of a microcapsule system, a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

By using the thin film transistor manufactured by the process described in any one of Embodiments 1 to 6 as a switching element, an electronic paper can be manufactured as a semiconductor device at low cost. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. An example of the electronic appliances is illustrated in FIG. 19B.

Figure 19B:
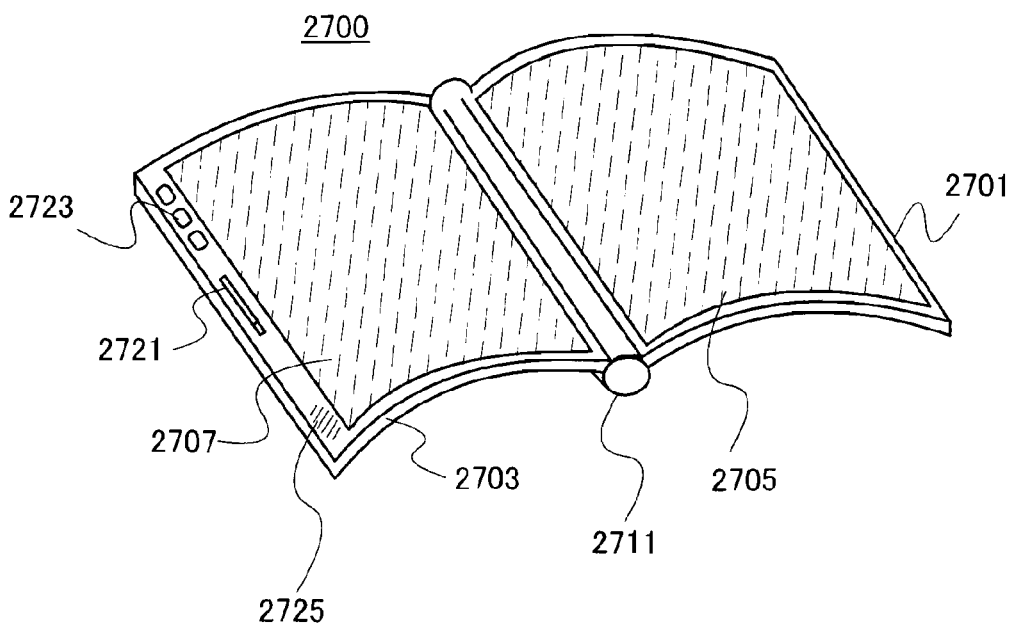

FIG. 19B illustrates an example of an e-book reader 2700. For example, the e-book reader 2700 includes two housings, a housing 2701 and a housing 2703. The housings 2701 and 2703 are bound with each other by an axis portion 2711, along which the e-book reader 2700 is opened and closed. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 19B) and graphics can be displayed on a display portion on the left side (the display portion 2707 in FIG. 19B).

FIG. 19B illustrates an example in which the housing 2703 is provided with an operation portion and the like. For example, the housing 2703 is provided with a power switch 2721, an operation key 2723, a speaker 2725, and the like. With the operation key 2723, pages can be turned. Note that a keyboard, a pointing device, and the like may be provided on the same surface as the display portion of the housing.

Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be implemented in appropriate combination with the structures described in the other embodiments.

Embodiment 11

A semiconductor device which has a thin film transistor manufactured by the process described in any one of Embodiments 1 to 6 can be applied to a variety of electronic appliances (including game machines).

Figure 20A:
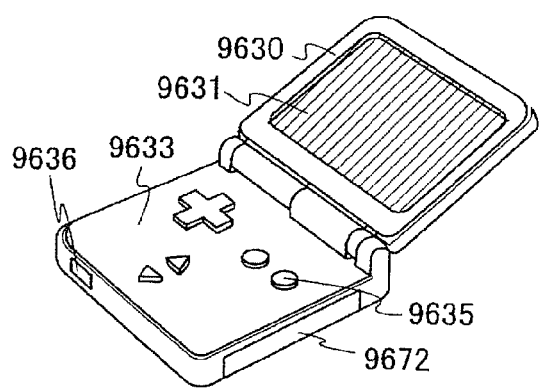
FIGS. 20A to 20C each illustrate an electronic appliance of one embodiment of the present invention.

FIG. 20A illustrates a portable game machine which includes a housing 9630, a display portion 9631, speakers 9633, operation keys 9635, a connection terminal 9636, a recording medium reading portion 9672, and the like. The portable game machine illustrated in FIG. 20A can have various functions such as a function of reading a program or data stored in a recording medium to display on the display portion; a function of sharing information by wireless communication with another portable game machine; or the like. Note that functions of the portable game machine illustrated in FIG. 20A are not limited to them, and the portable game machine can have various functions.

Figure 20B:
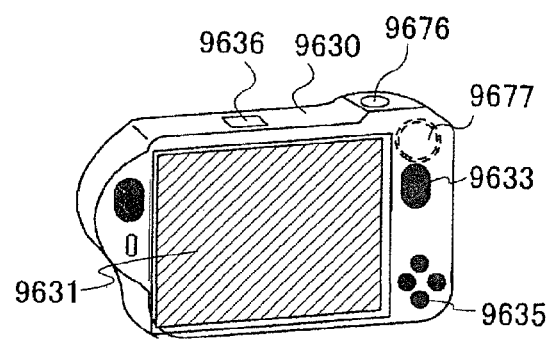

FIG. 20B illustrates a digital camera which includes a housing 9630, a display portion 9631, a speaker 9633, operation keys 9635, a connection terminal 9636, a shutter button 9676, an image receiving portion 9677, and the like. The digital camera having the television reception function illustrated in FIG. 20B can have various functions such as a function of photographing a still image and a moving image; a function of automatically or manually adjusting the photographed image; a function of obtaining various kinds of information from an antenna; a function of storing the photographed image or the information obtained from the antenna; and a function of displaying the photographed image or the information obtained from the antenna on the display portion. Note that functions of the digital camera having the television reception function illustrated in FIG. 20B are not limited to them, and the digital camera having the television reception function can have various functions.

Figure 20C:
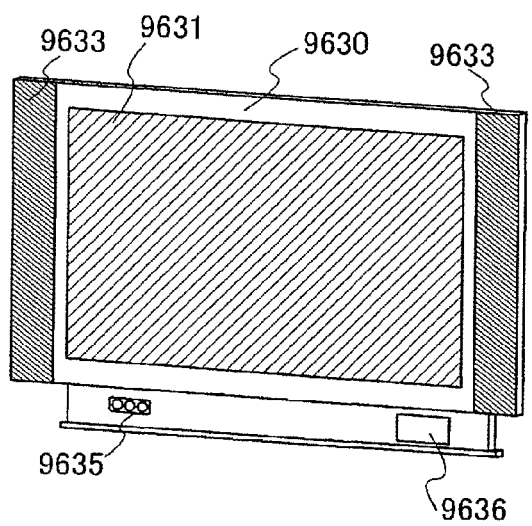

FIG. 20C illustrates a television receiver which includes a housing 9630, a display portion 9631, speakers 9633, operation keys 9635, a connection terminal 9636, and the like. The television receiver illustrated in FIG. 20C can have various functions such as a function of converting radio wave for television into an image signal; a function of converting an image signal into a signal which is suitable for display; and a function converting frame frequency of an image signal. Note that functions of the television receiver illustrated in FIG. 20C are not limited to them, and the television receiver can have various functions.

Figure 21A:
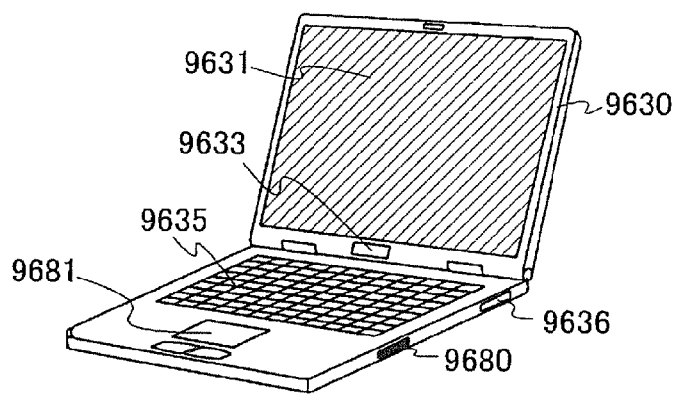
FIGS. 21A and 21B each illustrate an electronic appliance of an embodiment of the present invention.

FIG. 21A illustrates a computer, which includes a housing 9630, a display portion 9631, a speaker 9633, operation keys 9635, a connection terminal 9636, a pointing device 9681, an external connection port 9680, and the like. The computer illustrated in FIG. 21A can have various functions such as a function of displaying various kinds of information (e.g., a still image, a moving image, and a text image) on the display portion; a function of controlling processing by various kinds of software (programs); a communication function such as wireless communication or wire communication; a function of connecting with various computer networks by using the communication function; and a function of transmitting or receiving various kinds of data by using the communication function. Note that the functions of the computer illustrated in FIG. 21A are not limited to those, and the computer can have other various functions.

Figure 21B:
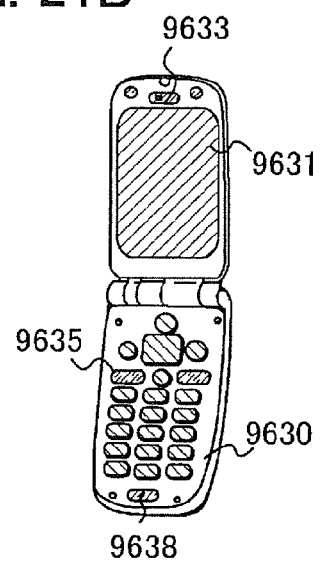

FIG. 21B illustrates a mobile phone, which includes a housing 9630, a display portion 9631, a speaker 9633, operation keys 9635, a microphone 9638, an external connecting port 9680, and the like. The mobile phone illustrated in FIG. 21B can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Note that the functions of the mobile phone illustrated in FIG. 21B are not limited to those, and the mobile phone can have other various functions.

The thin film transistor in the display portion for displaying information, which is included in the electronic appliance described in this embodiment, can be manufactured by the method for manufacturing a semiconductor device described in any of the above embodiments. That is, by the manufacturing method of a semiconductor device in which gate electrodes are provided over and below a channel formation region formed using an oxide semiconductor, increase of the number of processes can be suppressed and the threshold voltage can be controlled. Accordingly, a semiconductor device having high electric characteristics can be manufactured at low cost.

Note that the contents described in each drawing in this embodiment can be optionally combined with or replaced with the contents described in another embodiment as appropriate.

Example 1

In this example, simulation results are shown. The simulation was conducted to examine an effect of control of the threshold voltage by a second gate electrode in a thin film transistor manufactured by using the manufacturing method of a semiconductor device described in the above embodiments. Note that for the simulation, a device simulator "ATLAS" developed by Silvaco Data Systems Inc. was used.

Figure 22:
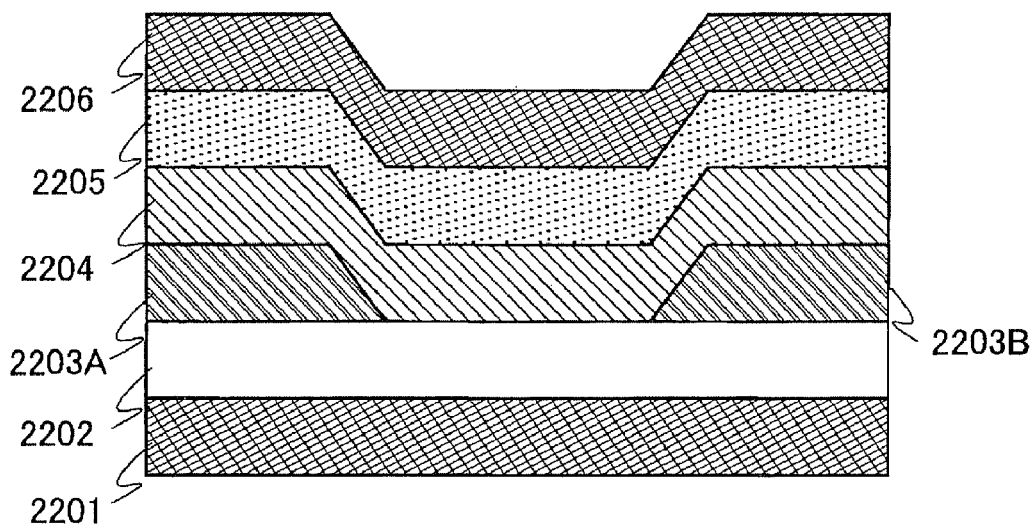
FIG. 22 is a view for describing Example of the present invention.

First, a device structure used for the simulation is illustrated in FIG. 22. A device structure illustrated in FIG. 22 is a modeling structure of a transistor with a bottom-gate bottom-contact structure described in the above embodiments, which includes a first gate electrode 2201, a first insulating film 2202, a source electrode 2203A, a drain electrode 2203B, an oxide semiconductor film 2204, a second insulating film 2205, and a second gate electrode 2206.

The conditions of the simulation with use of the structure of FIG. 22 were as follows: potentials of the first gate electrode 2201, the source electrode 2203A, the drain electrode 2203B, and the second gate electrode 2206 were set to from −20 V to 20 V, 0V, 10V, and from −5V to 5V, respectively; the oxide semiconductor film 2204 was formed to have a thickness of 50 nm, a channel length L of 5 μm, and a channel width W of 50 μm; the first insulating film 2202 (on the assumption of an oxynitiride silicon film (SiON)) was formed to have a thickness of 0.2 μm and a dielectric constant ∈ of 4.1; and the second insulating film 2205 (on the assumption of polyimide (PI)) was formed to have a thickness of from 0.1 μm to 1500 nm and a dielectric constant of 3.1 or 4.1. Note that as a parameter of the oxide semiconductor film, the band gap was set to 3.05 eV, the electron mobility was set to 15 cm²/Vs, the hole mobility was set to 0.1 cm²/Vs, the electron affinity was set to 4.3 eV, and the dielectric constant was set to 10.

The MOS structure illustrated in FIG. 22 can be approximately modeled to have a serial connection of a capacitor element. The formula made in this case is represented by Formula (1). In Formula (1), $C_f$ represents electrostatic capacitance between the first gate electrode 2201 and the oxide semiconductor film 2204, $C_b$ represents electrostatic capacitance between the second gate electrode 2206 and the oxide semiconductor film 2204, $V_s$ represents the potential of the oxide semiconductor film 2204, $V_g$ represents the potential of the first gate electrode 2201, and $V_b$ represents the potential of the second gate electrode 2206. According to Formula (1), the sum of the electric charge stored between the first gate electrode 2201 and the oxide semiconductor film 2204 and the electric charge stored between the second gate electrode 2206 and the oxide semiconductor film 2204 is constant.

$$C_f(V_s-V_g)+C_b(V_s-V_b)=\text{const.} \qquad (1)$$

On the assumption that the threshold voltage of the MOS structure illustrated in FIG. 22 is represented by $V_{th}$ and the potential of the oxide semiconductor film 2204 is represented by $V_{s0}$, Formula (1) is satisfied when the potential difference between the first gate electrode 2201 and the source electrode 2203A is equal to the threshold voltage. At this time, Formula (2) is satisfied.

$$C_f(V_{s0}-V_{th})+C_b(V_{s0}-V_b)=\text{const.} \qquad (2)$$

In this case, considered is the amount of shift in the threshold voltage $V_{th}$ when the potential $V_b$ of the second gate electrode 2206 is changed. $V_{s0}$ is determined depending on the relation with the potential of the source electrode 2203A and is required to have a constant value regardless of the potential $V_b$ of the second gate electrode 2206. Thus, by differentiating Formula (2) with $V_b$, Formula (3) is obtained.

$$-C_f\frac{dV_{th}}{dV_b}-C_b=0 \qquad (3)$$

When Formula (3) is arranged, Formula (4) is obtained, which represents the amount of shift in the threshold voltage with respect to the amount of change in the potential of the second gate electrode 2206. Note that in Formula (4), $\in_f$ represents the dielectric constant of the first insulating film 2202, $\in_b$ represents the dielectric constant of the second insulating film 2205, $t_f$ represents the thickness of the first insulating film 2202, and $t_b$ represents the thickness of the second insulating film 2205.

$$-\frac{\Delta V_{th}}{\Delta V_b}=\frac{C_b}{C_f}=\frac{\varepsilon_b}{\varepsilon_f}\frac{t_f}{t_b} \qquad (4)$$

Figure 23:
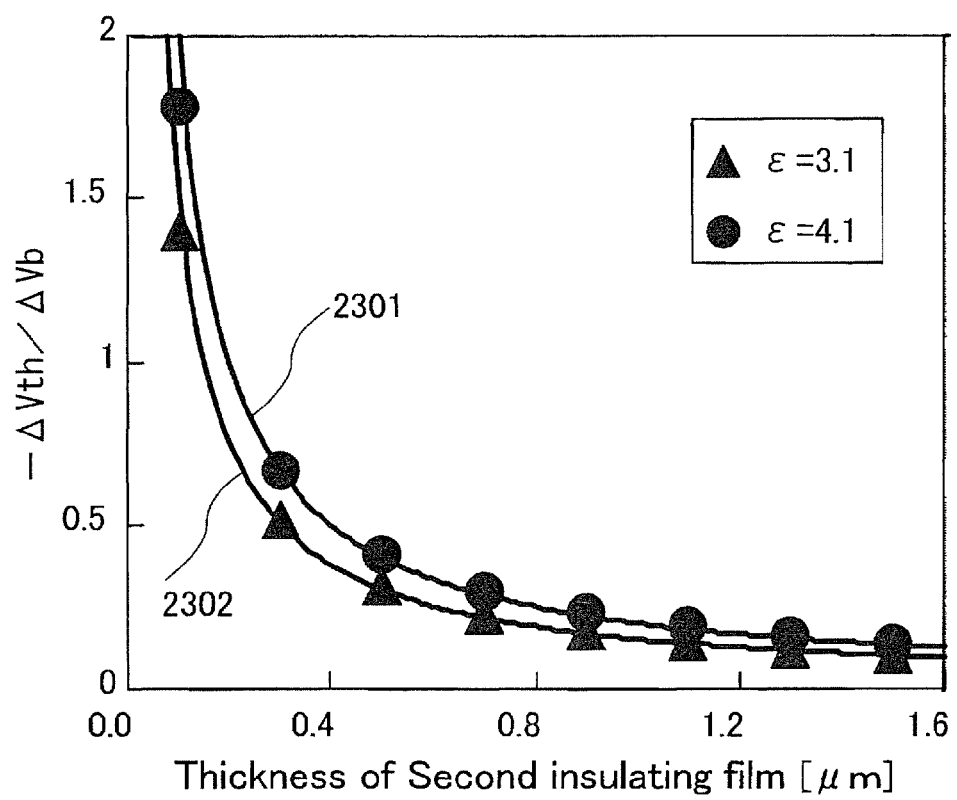
FIG. 23 is a graph for describing Example of the present invention.

FIG. 23 shows results of the device simulation of the structure illustrated in FIG. 22. In addition, the results obtained by inputting a variable into Formula (4) are also shown by curved lines in FIG. 23. The device simulation was for examination of a relation between the amount of shift in the threshold value $\Delta V_{th}$ with respect to the amount of change in the potential of the second gate electrode 2206 $\Delta V_b$ and the thickness of the insulating film on the back gate side. In the graph of FIG. 23, the horizontal axis represents the thickness of the second insulating film 2205 and the vertical axis represents $-\Delta V_{th}/\Delta V_b$. In FIG. 23, triangles indicate results of the device simulation under the condition where the dielectric constant ∈ of the second insulating film 2205 is 3.1, a curved line 2301 shows a result obtained by inputting a variable into Formula (4) under the condition where the dielectric constant c of the second insulating film 2205 is 3.1, circles indicate results of the device simulation under the condition where the dielectric constant ∈ of the second insulating film 2205 is 4.1, and a curved line 2302 shows a result obtained by inputting a variable into Formula (4) under the condition where the dielectric constant c of the second insulating film 2205 is 4.1.

Any of the results shown in FIG. 23 indicate that as the thickness of the second insulating film 2205 is increased, shift in $V_{th}$ with respect to the back gate bias becomes small. In addition, from any of the results shown in FIG. 23, the second insulating film 2205 whose thickness is larger than 0.5 μm (500 nm) is hardly affected by the back gate bias. Thus, it was found that the preferred thickness of the second insulating film 2205 was from 50 nm to 500 nm inclusive for the device which had large shift in the threshold voltage depending on change in potential of the second gate electrode.

In the manufacturing method of a semiconductor device described in the above embodiments, the second insulating film is formed over the oxide semiconductor film which has not been subjected to patterning yet. Accordingly, a step shape due to the thickness of the oxide semiconductor film is not formed in the second insulating film. As a result, the thickness of the second insulating film can be easily reduced. Therefore, by controlling the potential of the second gate electrode, the potential which is necessary for controlling the threshold voltage of the thin film transistor can be set to be low.

This application is based on Japanese Patent Application serial no. 2009-111693 filed with Japan Patent Office on May 1, 2009, the entire contents of which are hereby incorporated by reference.

EXPLANATION OF REFERENCE

100: substrate, 101: gate electrode, 111: gate insulating film, 112: wiring layer, 113: oxide semiconductor film, 121: oxide semiconductor film, 122: insulating film, 123: conductive layer, 124: channel protective film, 131: oxide semiconductor film, 132: gate insulating film, 133: gate electrode, 134: resist mask, 135: buffer layer, 136: channel protective film, 141: thin film transistor, 142: resin layer, 143: lead wiring, 144: pixel electrode, 580: substrate, 581: thin film transistor, 582: lead wiring, 588: electrode layer, 589: spherical particles, 595: filler, 596: substrate, 800: substrate, 801: pixel portion, 802: scan line driver circuit, 803: signal line driver circuit, 804: thin film transistor, 820: substrate, 822: signal line input terminal, 824: signal line, 827: pixel portion, 828: pixel, 829: pixel TFT, 830: storage capacitor, 831: pixel electrode, 832: capacitor line, 833: common terminal, 835: protective circuit, 1101: conductive layer, 1102: oxide semiconductor film, 1103: conductive layer, 1104: conductive layer, 1105: conductive layer, 1106: opening portion, 2201: gate electrode, 2202: insulating film, 2203A: source electrode, 2203B: drain electrode, 2204: oxide semiconductor film, 2205: insulating film, 2206: gate electrode, 2301: curved line, 2302: curved line, 2600: element substrate, 2601: counter substrate, 2602: sealant, 2603: element layer, 2604: liquid crystal layer, 2606: polarizing plate, 2607: polarizing plate, 2608: wiring circuit portion, 2609: flexible wiring board, 2611: reflective plate, 2612: circuit board, 2613: optical sheet, 2700: e-book reader, 2701: housing, 2703: housing, 2705: display portion, 2707: display portion, 2711: axis portion, 2721: power switch, 2723: operation key, 2725: speaker, 2912: LED control circuit, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: gate insulating film, 4021: interlayer insulating layer, 4028: lead wiring, 4029: lead wiring, 4030: pixel electrode layer, 4031: common electrode layer, 4032: polarizing plate, 4034: light-blocking layer, 4035: spacer, 4500: substrate, 4502: pixel portion, 4505: sealant, 4506: substrate, 4507: filler, 4508: interlayer insulating layer, 4509: thin film transistor, 4510: thin film transistor, 4511: light-emitting element, 4512: electroluminescent layer, 4513: electrode layer, 4515: connection terminal electrode, 4516: terminal electrode, 4517: electrode layer, 4519: anisotropic conductive film, 4520: partition, 4521: conductive layer, 4522: conductive layer, 585A: interlayer insulating layer, 585B: interlayer insulating layer, 587A: electrode layer, 587B: electrode layer, 590A: black fine particle, 590B: white fine particle, 6400: pixel, 6401: switching transistor, 6402: driver transistor, 6403: capacitor, 6404: light-emitting element, 6405: signal line, 6407: power supply line, 6408: common electrode, 7001: thin film transistor, 7002: light-emitting element, 7003: cathode, 7004: light-emitting layer, 7005: anode, 7006: partition, 7009: lead wiring, 7010: conductive film, 7011: thin film transistor, 7012: light-emitting element, 7013: cathode, 7014: light-emitting layer, 7015: anode, 7016: light-blocking film, 7017: interlayer insulating layer, 7019: lead wiring, 7021: thin film transistor, 7022: light-emitting element, 7023: cathode, 7024: light-emitting layer, 7025: anode, 7028: conductive film, 7029: lead wiring, 823A: scan line, 823B: control line, 9630: housing, 9631: display portion, 9633: speaker, 9635: operation key, 9636: connection terminal, 9638: microphone, 9672: recording medium insert portion, 9676: shutter button, 9677: image receiving portion, 9680: external connection port, 9681: pointing device, 2910B: light-emitting diode, 2910G: light-emitting diode, 2910R: light-emitting diode, 4003a: signal line driver circuit, 4003b: signal line driver circuit, 4503a: signal line driver circuit, 4504a: scan line driver circuit, 4518a: FPC, 6406A: scan line, 6406B: control line

The invention claimed is:

1. A method for manufacturing a semiconductor device comprising:
   forming a first conductive layer over an insulating surface;
   performing a first patterning to form a first gate electrode;
   forming a first insulating film over the first gate electrode;
   forming a second conductive layer over the first insulating film;
   performing a second patterning to form a wiring layer;
   forming an oxide semiconductor film, a second insulating film, and a third conductive layer over the first insulating film and the wiring layer;
   performing a third patterning to form an island-shaped oxide semiconductor film, an island-shaped second insulating film over the island-shaped oxide semiconductor film, and a second gate electrode over the island-shaped second insulating film;
   forming an interlayer insulating layer covering the first insulating film, the wiring layer, the island-shaped oxide semiconductor film, the island-shaped second insulating film, and the second gate electrode;
   performing a fourth patterning to form an opening portion reaching the second gate electrode and an opening portion reaching the wiring layer;
   forming a conductive material over the interlayer insulating layer; and
   performing a fifth patterning to form a lead wiring connected to the second gate electrode and a pixel electrode connected to the wiring layer.

2. A method for manufacturing a semiconductor device comprising:
   forming a first conductive layer over an insulating surface;
   performing a first patterning to form a first gate electrode;
   forming a first insulating film over the first gate electrode;
   forming a second conductive layer over the first insulating film;
   performing second patterning to form a wiring layer;

forming an oxide semiconductor film, a channel protective film, a second insulating film, and a third conductive layer over the first insulating film and the wiring layer;

performing a third patterning to form an island-shaped oxide semiconductor film, an island-shaped channel protective film over the island-shaped oxide semiconductor film, an island-shaped second insulating film over the island-shaped channel protective film, and a second gate electrode over the island-shaped second insulating film;

forming an interlayer insulating layer covering the first insulating film, the wiring layer, the island-shaped oxide semiconductor film, the island-shaped channel protective film, the island-shaped second insulating film, and the second gate electrode;

performing a fourth patterning to form an opening portion reaching the second gate electrode and an opening portion reaching the wiring layer;

forming a conductive material over the interlayer insulating layer; and performing a fifth patterning to form a lead wiring connected to the second gate electrode and a pixel electrode connected to the wiring layer.

3. The method for manufacturing a semiconductor device according to claim 1 or claim 2,
wherein the oxide semiconductor film is a first oxide semiconductor film,
wherein a second oxide semiconductor film is formed over the wiring layer by performing the second patterning, and
wherein a buffer layer formed from the second oxide semiconductor film is provided by performing the third patterning in a region where the oxide semiconductor film and the wiring layer overlap with each other.

4. The method for manufacturing a semiconductor device according to claim 1 or claim 2,
wherein the oxide semiconductor film is a first oxide semiconductor film, and
wherein a second oxide semiconductor film is formed below the wiring layer by performing the second patterning.

5. The method for manufacturing a semiconductor device according to claim 1 or claim 2,
wherein the lead wiring is provided to overlap with the second gate electrode.

6. The method for manufacturing a semiconductor device according to claim 1 or claim 2,
wherein the interlayer insulating layer is formed using polyimide.

7. The method for manufacturing a semiconductor device according to claim 2,
wherein the channel protective film is formed using amorphous silicon.

8. The method for manufacturing a semiconductor device according to claim 1 or claim 2,
wherein the oxide semiconductor film includes silicon oxide.

9. The method for manufacturing a semiconductor device according to claim 1 or claim 2,
wherein the lead wiring is formed to be connected to the first gate electrode.

10. The method for manufacturing a semiconductor device according to claim 1 or claim 2,
wherein the second insulating film is formed to a thickness of from 50 nm to 500 nm inclusive.

* * * * *